US012649146B2

(12) United States Patent
Zhu et al.

(10) Patent No.: US 12,649,146 B2
(45) Date of Patent: Jun. 9, 2026

(54) HIGHLY EFFICIENT AND DURABLE ON-DEVICE METAL SEQUESTERING TAPES FOR SOLAR CELLS AND MODULES

(71) Applicant: Alliance for Energy Innovation, LLC, Golden, CO (US)

(72) Inventors: Kai Zhu, Littleton, CO (US); Tao Xu, Naperville, IL (US)

(73) Assignees: Alliance for Energy Innovation, LLC, Golden, CO (US); Board of Trustees of Northern Illinois University, DeKalb, IL (US)

( * ) Notice: Subject to any disclaimer, the term of this patent is extended or adjusted under 35 U.S.C. 154(b) by 0 days.

(21) Appl. No.: 18/292,992

(22) PCT Filed: Jul. 21, 2022

(86) PCT No.: PCT/US2022/073991
§ 371 (c)(1),
(2) Date: Jan. 29, 2024

(87) PCT Pub. No.: WO2023/009962
PCT Pub. Date: Feb. 2, 2023

(65) Prior Publication Data

US 2024/0261757 A1 Aug. 8, 2024

Related U.S. Application Data

(60) Provisional application No. 63/227,462, filed on Jul. 30, 2021.

(51) Int. Cl.
*B01J 20/22* (2006.01)
*B01J 20/26* (2006.01)
(Continued)

(52) U.S. Cl.
CPC ............ *B01J 20/22* (2013.01); *B01J 20/261* (2013.01); *H10F 19/804* (2025.01); *H10F 77/12* (2025.01)

(58) Field of Classification Search
CPC .................................................... H10F 19/804
See application file for complete search history.

(56) References Cited

U.S. PATENT DOCUMENTS 5,851,401 A 12/1998 Horwitz et al.
11,174,277 B2 11/2021 Zhu et al.
(Continued)

FOREIGN PATENT DOCUMENTS

EP 1 502 934 A1 2/2005
EP 2 966 703 A1 1/2016
(Continued)

OTHER PUBLICATIONS

Horvath (Year: 2021).*
(Continued)

*Primary Examiner* — Sadie White
(74) *Attorney, Agent, or Firm* — Michael A. McIntyre

(57) ABSTRACT

The present disclosure relates to a composition that includes a metal-sequestering material and a support material, where the composition is substantially transparent to light having a wavelength greater than or equal to 350 nm, the composition is in the form of a layer having a thickness between 0.1 μm and 1 mm, the metal-sequestering material is capable of absorbing a metal that includes at least one of a post-transition metal, a metalloid, an alkali metal, and/or an alkaline earth metal, and the metal-sequestering material has an absorption capacity for the metal between about 1E-2 g metal/cm$^2$ and about 1E-7 g metal/cm$^2$.

14 Claims, 22 Drawing Sheets

(51) Int. Cl.
*H10F 19/80* (2025.01)
*H10F 77/12* (2025.01)

(56) References Cited

U.S. PATENT DOCUMENTS

| | | | | |
|---|---|---|---|---|
| 2002/0100732 | A1 | 8/2002 | Atwood et al. | |
| 2009/0260675 | A1* | 10/2009 | Erdemli | H10F 19/902 136/251 |
| 2010/0180943 | A1* | 7/2010 | Smith | B32B 17/10761 156/60 |
| 2011/0160150 | A1 | 6/2011 | Haley et al. | |
| 2011/0186102 | A1* | 8/2011 | Kobayashi | H10F 19/31 438/93 |
| 2012/0167958 | A1* | 7/2012 | Smith | B32B 17/10761 438/66 |
| 2013/0306521 | A1 | 11/2013 | O'Rear et al. | |
| 2014/0287366 | A1 | 9/2014 | Shukla et al. | |
| 2016/0152563 | A1 | 6/2016 | Calmes, Jr. et al. | |
| 2017/0201191 | A1* | 7/2017 | Wu | H10K 10/20 |
| 2017/0323989 | A1 | 11/2017 | Moslehi et al. | |
| 2020/0189927 | A1 | 6/2020 | Whitaker et al. | |
| 2020/0377533 | A1 | 12/2020 | Zhu et al. | |
| 2020/0395491 | A1* | 12/2020 | Naito | H05B 33/28 |
| 2022/0024954 | A1 | 1/2022 | Zhu et al. | |

FOREIGN PATENT DOCUMENTS

| | | | |
|---|---|---|---|
| KR | 101 811 243 | B1 | 1/2018 |
| WO | 2014202965 | A1 | 12/2014 |
| WO | 2020172644 | A1 | 8/2020 |

OTHER PUBLICATIONS

Li (Year: 2020).*
Wu (Year: 2020).*
Kim (Year: 2019).*
Yi (Year: 2020).*
Dedecker (Year: 2020).*
Babayigit, A. et al., "Assessing the toxicity of Pb- and Sn-based perovskite solar cells in model organism Danio rerio," Scientific Reports, Jan. 2016; DOI:10.1038/srep18721, 11 pages.
Babayigit, A. et al., "Toxicity of organometal halide perovskite solar cells," Nature Materials, vol. 15, Mar. 2016, 5 pages.
Babaygit, A. et al., "Environment versus sustainable energy: The case of lead halide perovskite-based solar cells," MRS Energy & Sustainability: A Review Journal; 2018; DOI:10.1557/mre.2017.17, 15 pages.
Bae, S.Y. et al., "Hazard potential of perovskite solar cell technology for potential implementation of "safe-by-design" approach," Scientific Reports, vol. 9, 2019, 9 pages.
Barbieri, L. et al., "Rapid screening of different chelating agents in the lead extraction from cathode ray tube (CRT) funnel glass," Environ. Sci. Pollut. Res (2014) vol. 21, 7 pages.
Becke, A., "Density-functional thermochemistry. III. The Role of exact exchange.", J. Chem. Phys., vol. 98, No. 7, Apr. 1993, 5 pages.
Binek, A. et al., "Recycling Perovskite Solar Cells to Avoid Lead Waste," ACS Applied Materials & Interfaces, vol. 8, 2016, 6 pages.
Chen, M. et al., "Highly stable and efficient all-inorganic lead-free perovskite solar cells with native-oxide passivation," Nature Communications, DOI.org/10.1038/s41467-018-07951-y, 8 pages.
Chen, R. et al., "High-Efficiency, Hysteresis-Less, UV-Stable Perovskite Solar Cells with Cascade ZnO—ZnS Electron Transport Layer," J. of the American Chemical Society, vol. 141, 2019, pp. 541-547.
Chen, S. et al., "Trapping lead in perovskite solar modules with abundant and low-cost catio-exchange resins," Nature Energy, vol. 5, Dec. 2020, 9 pages.
Chen, S. et al., "Preventing lead leakage with built-in resin layers for sustainable perovskite solar cells," Nature Sustainability, vol. 4, Jul. 2021, 10 pages.
Conings, B. et al., "Fire Safety of Lead Halide Perovskite Photovoltaics," ACS Energy Letters, vol. 4, 2019, pp. 873-878.
Daniels, Y. et al., "Modification of Hydroxyapatite with Ion-Selective Complexants: 1-Hydroxyethane-1,1-diphosphonic Acid," Industrial and Engineering Chemistry Research, vol. 54, 2015, 12 pages.
Fabini, D. et al., "Quantifying the Potential for Lead Pollution from Halide Perovskite Photovoltaics," J. of Physical Chem. Letters, vol. 6, 2015, pp. 3546-3548.
Fang, Y. et al., "Complexing Cations by Poly(ethylene oxide): Binding Site and Binding Mode," Journal of Physical Chemistry B, vol. 121, 2017, 10 pages.
Giddings, J.C. et al., "Resolution and Peak Capacity in Equilibrium-Gradient Methods of Separation," Separation Science, vol. 6, No. 3, Jun. 1971, pp. 345-356.
Grimme, S., "Semiempirical GGA-Type Density Functional Constructed with a Long-Range Dispersion Correction," Wiley, InterScience, DOI 10.1002/jcc.20495, 13 pages.
Hailegnaw, B. et al., "Rain on Methylammonium Lead Iodide Based Perovskites: Possible Environmental Effects of Perovskite Solar Cells," J. of Physical Chem. Letters, vol. 6, 2015, pp. 1543-1547.
Hoefler, S. et al., "Progress on lead-free metal halide perovskites for photovoltaic applications: a review," Monatsch Chem, vol. 148, 2017, 32 pages.
Horwitz, E. et al., "DIPEX: A new extraction chromatographic material for the separation and preconcentration of actinides from aqueous solution," Reactive & Functional Polymers, vol. 33, 1997, 12 pages.
Hsiao, M.C. et al., "Bidentate chelating ligands as effective passivating materials for perovskite light-emitting diodes," RSC Phys. Chem. Chem. Phys., vol. 21, 2019, pp. 7867-7873.
Huang, F. et al., "From scalable solution fabrication of perovskite films towards commercialization of solar cells," Energy & Environmental Science, 2018, DOI:10.1039/c8ee03025a, 32 pages.
Huang, X. et al., "Zero-wastewater capacitive deionization: selective removal of heavy metal ions in tap water assisted by phosphate ions," Environmental Science Nano Paper, vol. 6, 2019, 7 pages.
Huckaba, A.J. et al., "Lead Sequestration from Perovskite Solar Cells Using a Metal-Organic Framework Polymer Composite," Energy Technology, vol. 8, 2020, 6 pages.
Jena, A. et al., "Role of spiro-OMeTAD in performance deterioration of perovskite solar cells at high temperature and reuse of the perovskite films to avoid Pb-waste," J. of Materials Chemistry A, vol. 6, 2018, pp. 2219-2230.
Jiang, Y. et al., "Reduction of lead leakage from damaged lead halide perovskite solar modules using self-healing polymer-cased encapsulation," Nature Energy, vol. 4, Jul. 2019, pp. 585-593.
Jokar, E. et al., "RobustTin-Based Perovskite Solar Cells with Hybrid Organic Cations to Attain Efficiency Approaching 10%," Advanced Materials Communication, vol. 31, 2019, 7 pages.
Jung, E. et al., "Efficient, stable and scalable perovskite solar cells using poly (3-hexylthiophene)," Letter, vol. 567, Mar. 28, 2019, 19 pages.
Ke, W. et al., "Unleaded Perovskites: Status Quo and Future Prospects of Tin-Based Perovskite Solar Cells," Advanced Materials Review, vol. 31, 2019, 31 pages.
Lee, C. et al., "Development of the Colle-Salvetti correlation-energy formula into a functional of the electron density," Physical Review B, The American Physical Society, vol. 37, No. 2, Jan. 1988, 5 pages.
Lee, J. et al., "Nonaromatic Green-Solvent-Processable, Dopant-Free, and Lead-Capturable Hole Transport Polymers in Perovskite Solar Cells with High Efficiency," Advanced Energy Materials, vol. 10, 2020, 7 pages.
Leyden, M. et al., "Methylammonium Lead Bromide Perovskite Light-Emitting Diodes by Chemical Vapor Deposition," J. Phys. Chem. Lett., vol. 8, 2017, pp. 3193-3198.
Li, X. et al., "On-device lead sequestration for perovskite solar cells," Nature, vol. 578, Feb. 27, 2020, 17 pages.
Lyu, M. et al., "Addressing Toxicity of Lead: Progress and Applications of Low-Toxic Metal Halide Perovskites and Their Derivatives," Adv. Energy Materials, vol. 7, 2017, 26 pages.

(56) References Cited

OTHER PUBLICATIONS

Mokhtar, M.Z. et al., "Bioinspired scaffolds that sequester lead ions in physically damaged high efficiency perovskite solar cells," ChemComm Communication, vol. 57, 2021, 4 pages.
Pinto, I. and Neto, I., "Biodegradable chelating agents for industrial, domestic, and agricultural applications—a review," Environ Sci. Pollut. Res., vol. 21, 2014, 14 pages.
Puljula, E. et al., "Structural Requirements for Bisphosphonate Binding on Hydroxyapatite: NMR Study of Bisphosphonate Partial Esters," ACS Medicinal Chemistry Letters, vol. 6, 2015, pp. 397-401.
Qiu, L. et al., "Advances and challenges to the commercialization of organic-inorganic halide perovskite solar cell technology," Materials Today Energy, vol. 7, 2018, 21 pages.
Sato, H. et al., Ionic Diffusion Coefficients of Cs+, PB2+, Sm3+, Ni2+, SeO2-4 and TcO-4 in Free Water Determined from Conductivity Measurements, Journal of Nuclear Science and Technology, vol. 33, No. 12, 2012, 7 pages.
Serrano-Lujan, L. et al., "Tin- and Lead-Based Perovskite Solar Cells under Scrutiny: An Environmental Perspective," vol. 5, 2015, 5 pages.
Stoumpos, C .et al., "Semiconducting Tin and Lead Iodide Perovskites with Organic Cations: Phase Transitions, High Mobilities, and Near-Infrared Photoluminescent Properties," Inorganic Chemistry, vol. 52, 2013, pp. 9019-9038.
Tomasi, J. et al., "Quantum Mechanical Continuum Solvation Models," Chem. Re. 2005, vol. 105, pp. 2999-3093.
Wu, S. et al., "A chemically inert bismuth interlayer enhances long-term stability of inverted perovskite solar cells," Nature Communications, DOI.org/10.1038/s41467-019-09167-0, 11 pages.
Wu, S. et al., "2D metal-organic framework for stable perovskite solar cells with minimized lead leakage," Nature Nanotechnology, vol. 15, Nov. 2020, 11 pages.
Yang, J. et al., "High-Performance Perovskite Solar Cells with Excellent Humidity and Thermo-Stability via Fluorinated Perylenediimide," Advanced Energy Materials, vol. 9, 2019, 9 pages.
Yoo, Y. et al., "Evaluating the environmental impact of the lead species in perovskite solar cells via environmental-fate modeling," Journal of Industrial and Engineering Chemistry, vol. 70, 2019, 9 pages.
Zhang, F. et al., "Self-Seeding Growth for Perovskite Solar Cells with Enhanced Stability," Jul. 3, 2019, pp. 1452-1463.
Zhang, Q. et al., "Perovskite solar cells: must lead be replaced—and can it be done?", Science and Tech. of Advanced Materials, vol. 19, No. 1, 2018, pp. 425-442.
International Search Report and Written Opinion from PCT/US20/12712, dated Apr. 2, 2020, 7 pages.
European Extended Search Report for EP patent application No. 20813544.2, dated Jun. 26, 2023, 10 pages.
PCT Search Report and Written Opinion from PCT patent application, PCT/US22/73991, dated Feb. 7, 2023, 10 pages total.

* cited by examiner

A)

B)

n-i-p devices p-i-n devices

Glass side

Glass side

HIGHLY EFFICIENT AND DURABLE ON-DEVICE METAL SEQUESTERING TAPES FOR SOLAR CELLS AND MODULES

CROSS-REFERENCE TO RELATED APPLICATIONS

This application claims priority from U.S. Provisional Patent Application No. 63/227,462 filed on Jul. 30, 2021, the contents of which are incorporated herein by reference in their entirety.

CONTRACTUAL ORIGIN

This invention was made with government support under Contract Nos. DE-AC36-08GO28308 and DE-EE0008989 awarded by the Department of Energy. The government has certain rights in the invention.

BACKGROUND

As the power conversion efficiency (PCE) of perovskite solar cells (PSCs) have reached above 25.2%, the commercialization of PSCs appears to be imminent due to its lower fabrication cost, simpler manufacturing processes, and larger processing area over Si-based solar cells that currently dominate the photovoltaic (PV) market. While many efforts have focused on tackling the stability and scalability issues with promising advances, the potential lead (Pb) toxicity issue has remained a concern for PSCs. Unlike the metallic Pb, the Pb ions in perovskite generally exhibit high solubility in water. However, lead has so far appeared to be a necessary component in all high-efficiency PSCs. Thus, there remains a need for developing methods and devices that address the issues facing PSCs due to lead toxicity.

SUMMARY

An aspect of the present disclosure is a composition that includes a metal-sequestering material and a support material, where the composition is substantially transparent to light having a wavelength greater than or equal to 350 nm, the composition is in the form of a layer having a thickness between 0.1 μm and 1 mm, the metal-sequestering material is capable of absorbing a metal that includes at least one of a post-transition metal, a metalloid, an alkali metal, and/or an alkaline earth metal, and the metal-sequestering material has an absorption capacity for the metal between about 1E-2 g metal/$cm^2$ and about 1E-7 g metal/$cm^2$.

In some embodiments of the present disclosure, the metal may include at least one of lead and/or tin. In some embodiments of the present disclosure, the layer may be positioned on a tube configured to be used in a roll-to-roll manufacturing process. In some embodiments of the present disclosure, the metal-sequestering material may include at least one of P, P'-di(2-ethylhexyl)methanediphosphonic acid (DMDP), N,N,N',N'-ethylenediaminetetrakis(methylenephosphonic acid), dimercaptosuccinic acid, ethylenediaminetetraacetic acid, nitrilotriacetic acid, ethylenediaminedisuccinic acid, iminodisuccinic acid, methylglycine diacetic acid, L-Glutamic acid N,Ndiacetic acid, 2-hydroxyethyliminodiacetic acid, ethylenediamine-N,N'-dimalonic acid, ethylenediamine-N,N'-diglutaric acid, 3-hydroxy-2,2-iminodisuccinic acid, and/or 2,6-pyridine dicarboxylic acid, poly ethylene glycol, poly vinyl alcohol, and/or poly vinyl pyrrolidone.

In some embodiments of the present disclosure, the metal-sequestering material may be P, P'-di(2-ethylhexyl)methanediphosphonic acid (DMDP). In some embodiments of the present disclosure, the support material may include at least one of a polyolefin, an epoxy resin, a silicone, an acrylic, and/or a polyester. In some embodiments of the present disclosure, the support material may include at least one of ethylene vinyl acetate (EVA), (polyvinylidene fluoride), polyethylene (PE), polypropylene (PP), polymethylpentene (PMP), polybutene-1 (PB-1), polydimethylsiloxane, bisphenol A diglycidyl ether, polymethylmethacrylate, polyhydroxyethylmethacrylate, and/or polyethylene terephthalate. In some embodiments of the present disclosure, the support material may be ethylene vinyl acetate (EVA). In some embodiments of the present disclosure, the layer may include a first layer and a second layer where the first layer may include the metal-sequestering material, the second layer may include the support material, and the first layer may be positioned adjacent to the second layer. In some embodiments of the present disclosure, the first layer may be in physical contact with the second layer. In some embodiments of the present disclosure, the first layer may have a thickness between 0.1 μm and 1 mm. In some embodiments of the present disclosure, the second layer may have a thickness between 0.1 μm and 1 mm.

An aspect of the present disclosure is a device that includes a perovskite-containing layer, and a metal-sequestering tape, where the device has a front-side and a back-side and the metal-sequestering tape is configured to isolate at least the front-side and the back-side from an external environment. In some embodiments of the present disclosure, the metal-sequestering tape may include a metal-sequestering material and a support material, where the metal-sequestering tape is substantially transparent to light having a wavelength greater than or equal to about 350 nm, the metal-sequestering tape has a thickness between 0.1 μm and 1 mm, the metal-sequestering material is capable of absorbing a metal that includes at least one of a post-transition metal, a metalloid, an alkali metal, and/or an alkaline earth metal, and the metal-sequestering material has an absorption capacity for the metal between about 1E-2 g metal/$cm^2$ and about 1E-7 g metal/$cm^2$.

An aspect of the present disclosure is a roll-to-roll manufacturing method that includes manufacturing a device by applying a perovskite-containing layer to a substrate and encapsulating the device within a metal-sequestering tape, where the metal-sequestering tape includes a metal-sequestering material and a support material. Further, the metal-sequestering tape is substantially transparent to light having a wavelength greater than or equal to about 350 nm, the metal-sequestering tape has a thickness between 0.1 μm and 1 mm, the metal-sequestering material is capable of absorbing a metal that includes at least one of a post-transition metal, a metalloid, an alkali metal, and/or an alkaline earth metal, and the metal-sequestering material has an absorption capacity for the metal between about 1E-2 g metal/$cm^2$ and about 1E-7 g metal/$cm^2$.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 8A illustrates accumulated lead concentrations of water after passing over and/or through damaged devices encapsulated by only EVA layers after 1 hour in comparison with the lead concentration profile of the water concentrations from water passing over and/or through devices encapsulated with DMDP-laminated EVA tapes over 10 hours. FIGS. 8B and 8C illustrate lead concentrations resulting from immersing damaged n-i-p and p-i-n PSCs encapsulated with a bare EVA layer and DMDP-laminated EVA tapes in water for seven days, respectively, according to some embodiments of the present disclosure.

DETAILED DESCRIPTION

Figure 1A:
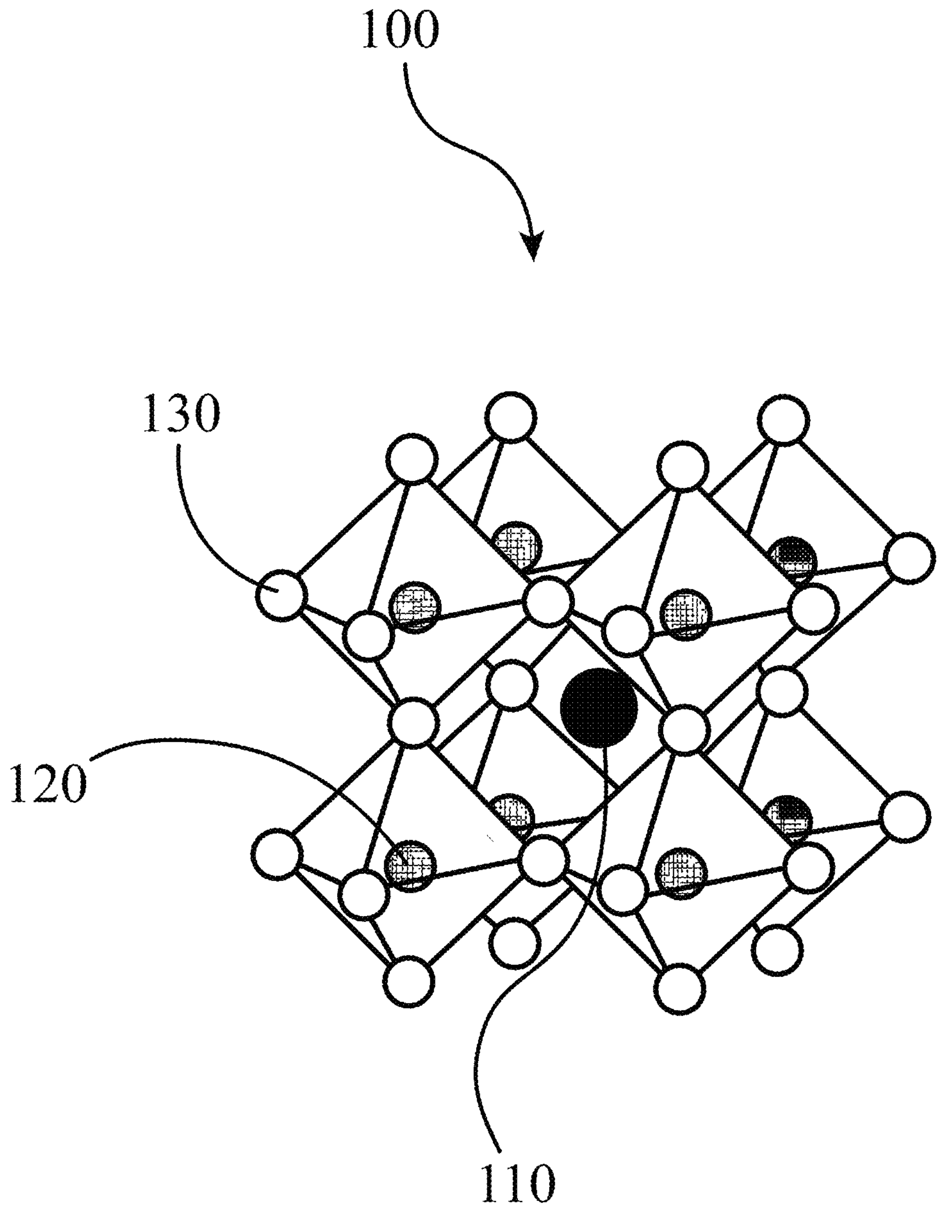
FIGS. 1A and 1B illustrate a perovskite in a corner-sharing, cubic phase arrangement, according to some embodiments of the present disclosure.

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term “substantially” is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term “substantially”. In some embodiments of the present invention, the term “substantially” is defined as approaching a specific numeric value or target to within 20%, 15%, 10%, 5%, or within 1% of the value or target. In further embodiments of the present invention, the term “substantially” is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term “about” is used to indicate that exact values are not necessarily attainable. Therefore, the term “about” is used to indicate this uncertainty limit. In some embodiments of the present invention, the term “about” is used to indicate an uncertainty limit of less than or equal to ±20%, ±15%, ±10%, ±5%, or ±1% of a specific numeric value or target.

In some embodiments of the present invention, the term “about” is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to compositions, devices, and methods designed to eliminate or minimize the release of metals such as lead and tin from perovskite-containing solar cells and/or modules into the environment. In some embodiments of the present disclosure, a metal-sequestering tape may be used to encapsulate solar cells and/or solar modules, such that at the end-of-life, especially when damaged, the metals are contained within the solar cells/modules by the sequestration of the metals by the tape. As described herein, in some embodiments of the present disclosure, a metal-sequestering tape may be a two-layer laminate constructed of a first support layer and a second metal-sequestering layer. In some embodiments of the present disclosure, the solar cells/modules encapsulated by the tapes described herein may be perovskite solar cells (PSCs) containing at least one of lead or tin. In some embodiments of the present disclosure, a metal-sequestering tap may include a single composite layer constructed of a mixture of a supporting material and a metal-sequestering material. In some embodiments of the present disclosure, a supporting material may be a continuous phase in which, a metal-sequestering material may be mixed as a dispersed phase.

Figure 1B:
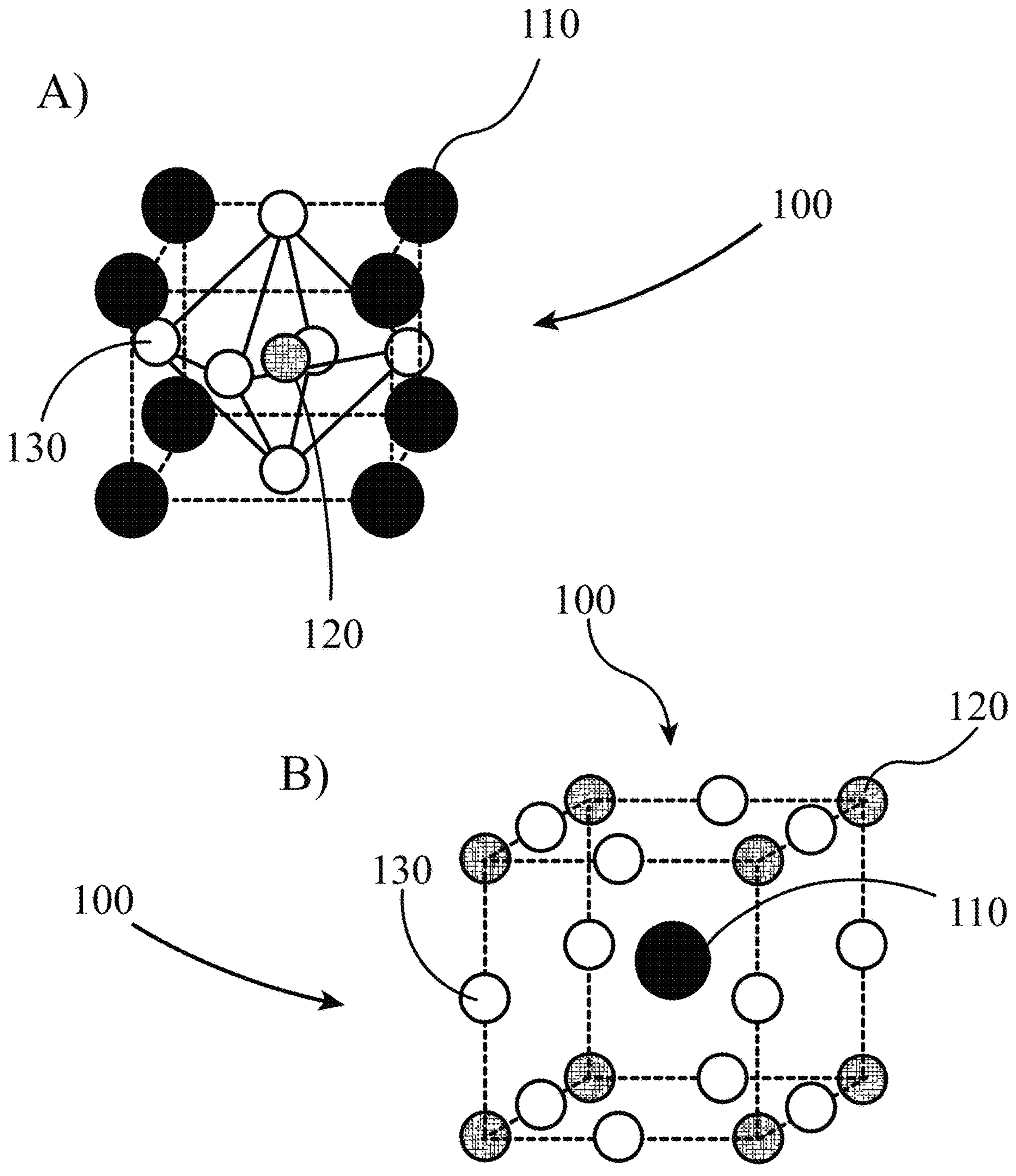

As defined herein, the term “perovskite” refers to compositions having a network of corner-sharing $BX_6$ octahedra resulting in the general stoichiometry of $ABX_3$. FIGS. 1A and 1B illustrate that perovskites 100, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 1A illustrates that a perovskite 100 having an α-phase structure may be further characterized by eight $BX_6$ octahedra surrounding a central A-cation 110, where each octahedra is formed by six X-anions 130 surrounding a central B-cation 120 and each of the octahedra are linked together by “corner-sharing” of anions, X (130).

Panel A of FIG. 1B provides another visualization of a perovskite 100 in the α-phase, also referred to as the cubic phase. This is because, as shown in FIG. 1B, a perovskite in the α-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 1B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 1B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 1B, the stoichiometry simplifies to B=1, A=8*0.125=1, and X=6*0.5=3, or $ABX_3$. Similarly, referring again to Panel B of FIG. 1B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 1B, the X-anions 130 and the B-cations 120 of a perovskite in the α-phase are aligned along an axis; e.g. where the angle at the X-anion 130 between two neighboring B-cations 120 is exactly 180 degrees, referred to herein as the tilt angle. However, as shown in FIG. 2, a perovskite 100 may assume other corner-sharing crystalline phases having tilt angles not equal to 180 degrees.

Figure 2:
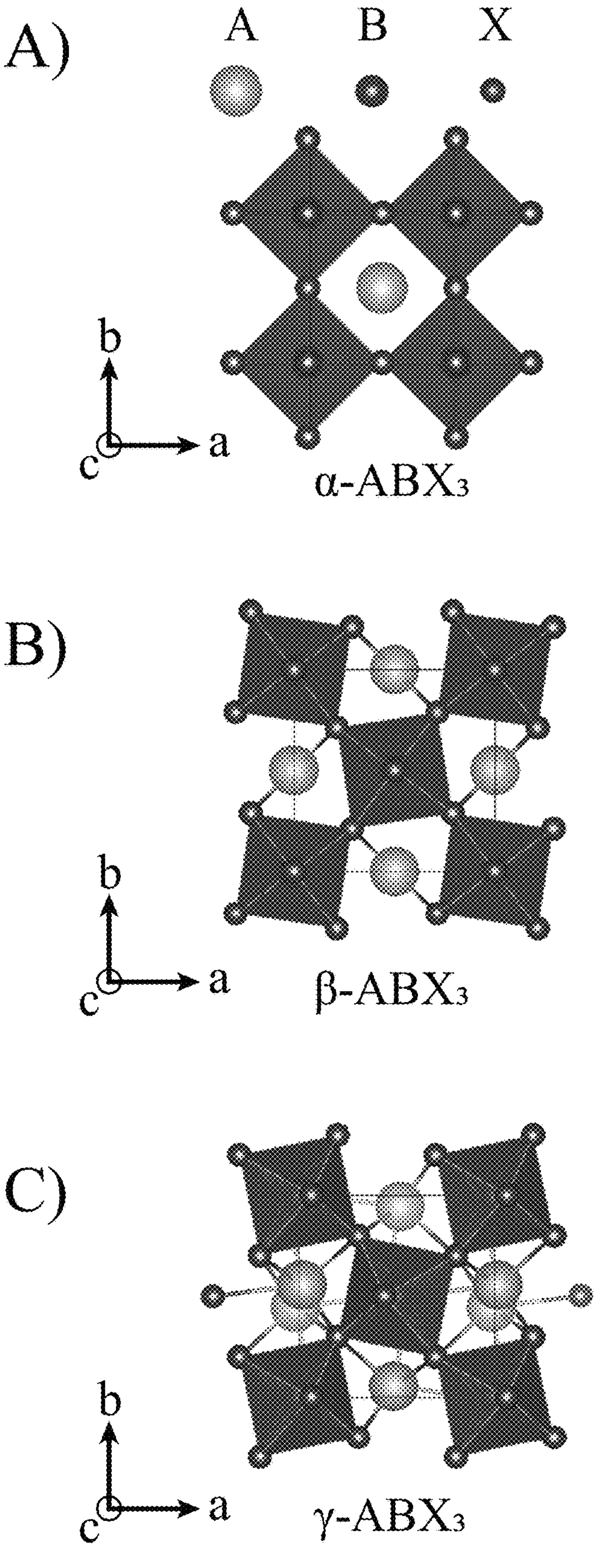
FIG. 2 illustrates three possible corner-sharing phases for perovskites, (Panel A) cubic phase (i.e., $\alpha$-$ABX_3$), (Panel B) a tetragonal crystalline phase (i.e., $\beta$-$ABX_3$), and (Panel C) an orthorhombic crystalline phase (i.e., $\gamma$-$ABX_3$), according to some embodiments of the present disclosure.

FIG. 2 illustrates that a perovskite can assume other crystalline forms while still maintaining the criteria of an $ABX_3$ stoichiometry with neighboring $BX_6$ octahedra maintaining X anion (130) corner-sharing. Thus, in addition to α-$ABX_3$ perovskites (in the cubic phase) having a tilt angle of 180 degrees, shown in Panel A of FIG. 2, a perovskite may also assume a tetragonal crystalline phase (i.e., β-$ABX_3$) (see Panel B of FIG. 2) and/or an orthorhombic crystalline phase (i.e., γ-$ABX_3$) (see Panel C of FIG. 2), where the adjacent octahedra are tilted relative to the reference axes a, b, and c.

Figure 3:
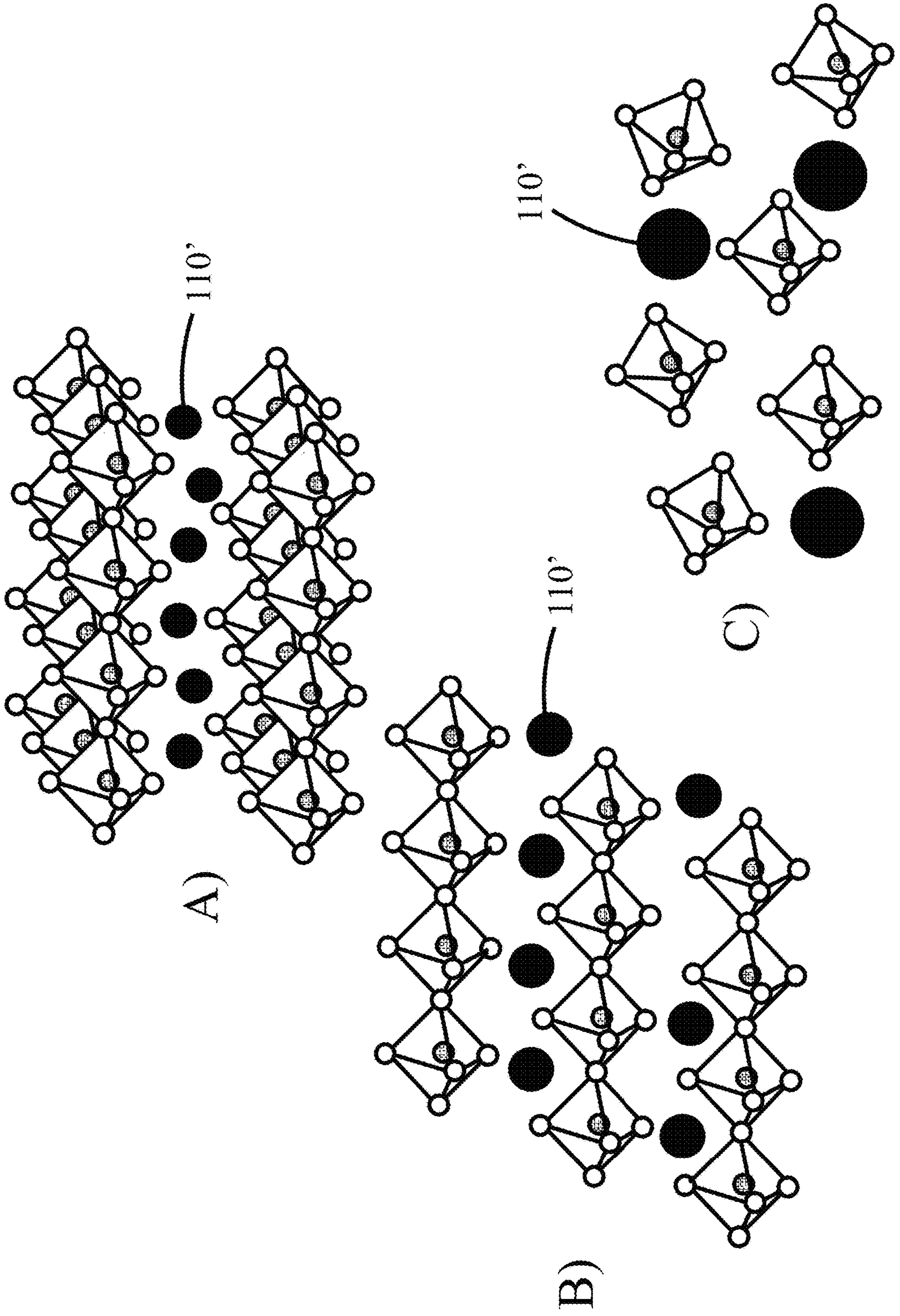
FIG. 3 illustrates 2D, 1D, and 0D perovskite-like structures, in Panels A, B, and C, respectively, according to some embodiments of the present disclosure.

Further, referring now to FIG. 3, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 3, such lower dimensional, perovskite-like structures still include the $BX_6$ octahedra, and depending on the dimensionality, e.g., 2D or 1D, may still maintain a degree of X-anion corner-sharing. However, as shown in FIG. 3, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 3, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}B_nX_{3n+1}$, where monovalent (m=2) or divalent (m=1) A' cations 110' can intercalate between the X-anions of 2D perovskite-like sheets. Referring to Panel B of FIG. 3, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 3, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3$+) propylammonium ($CH_3CH_2CH_2NH_3^+$), butylammonium ($CH_3CH_2CH_2CH_2NH_3^+$), formamidinium ($NH_2CH{=}NH_2$+), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_3$—$Br_x$. Thus, a perovskite 100 may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g. at least one of I, Br, Cl, and/or F), thiocyanate, and/or sulfur. Any combination is possible provided that the charges balance.

For example, a perovskite having the basic crystal structure illustrated in FIGS. 1A and 1B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Previously, we reported a lead sequestration efficiency (SQE, see Equation 1 below) of more than 96% of lead leakage through a chemical absorption approach upon severe device damage by positioning the PSC between two lead-sequestering layers. This concept has published as U.S. Patent Application Publication No. 2020-0377533A1, which is incorporated herein by reference in its entirety. The present disclosure builds on the concepts presented in our earlier work, by providing components, systems, and methods for conveniently applying durable and highly efficient lead-sequestering tapes to perovskite solar cell (PSC) stacks in ways suitable for "standard" PSC configurations and high-speed roll-to-roll manufacturing methods.

amido group. Sulfur-containing groups that may sequester a metal include at least one of a thiol group, a sulfide group, a disulfide group, a sulfoxide group, a sulfone group, a $$SQE = \left(1 - \frac{Pb \text{ leakage from devices with } Pb \text{ absorbers on both sides}}{Pb \text{ leakage from devices without any } Pb \text{ absorbers}}\right) 100\%$$ Equation 1

For example, presented herein are lead-sequestering tapes constructed using an ethylene vinyl acetate (EVA) support layer positioned on a lead-sequestering layer (e.g., P, P'-di (2-ethylhexyl)methanediphosphonic acid (DMDP)), which can then be easily mounted, positioned, and/or applied to one or both sides of as-fabricated PSCs (both n-i-p and p-i-n configurations). Other materials that may be used as a support layer include polyvinylidene fluoride (PVDF) and various polyolefins. Examples of suitable polyolefins include polyethylene (PE), polypropylene (PP), polymethylpentene (PMP), polybutene-1 (PB-1), ethylene-octene copolymers, and/or propylene-butane copolymers. Other suitable materials for support materials include epoxy resins (e.g., bisphenol A diglycidyl ether), silicones (e.g., polydimethylsiloxanes), acrylics (e.g., polymethylmethacrylate, polyhydroxyethylmethacrylate), and/or polyesters (e.g., polyethylene terephthalate). Specific brand names of materials suitable for support layers are Bynel™ resin and Surlyn™ resin. Any one or combination of these materials may be used as the support material in a single layer metal sequestering tape.

Although the current disclosure focuses on the use of metal-sequestering tapes for encapsulating lead and/or tin containing perovskite solar cells and modules, these tapes may be suitable for a variety of other applications, including the encapsulating of other types of solar cells such as CdTe, organic photovoltaics, CIGS.

In some embodiments of the present disclosure, a sequestering material (e.g., metal-sequestering composition) used for a sequestering layer of metal-sequestering tape may include a compound configured to interact with a metal by at least one of chelation, binding, reacting, ionically interacting, and/or physically adsorbing the metal. As used herein, the terms "binding" and "bonding" refer to charge-charge interactions between neighboring atom, ions, and/or molecules. As used herein, the term "chelating" refers to a type of bonding of ions and molecules to metal ions, which involves the formation or presence of two or more separate coordinate bonds between a polydentate (multiple bonded) ligand and a single central atom. These ligands are called chelants, chelators, chelating agents and/or extractants, which can include organic compounds. In some embodiments of the present disclosure, a sequestering material for sequestering a target material may include at least one of a ketone, an aldehyde, a carboxylic acid, an ester, an ether, and/or a carbonate. In some embodiments of the present disclosure, a sequestering material for sequestering an element and/or molecule may include at least one of hydrogen, phosphorus, nitrogen, sulfur, oxygen, carbon, and/or silicon.

For example, a sequestering material may include at least one of an amine group, an amide group, a hydrazine group, an isocyanate group, a nitrile group, and/or a nitrite group. Additional nitrogen-containing groups that may sequester a metal include at least one of an amino group (primary, secondary, and/or tertiary), an imino group, an imido group, a hydrazine group, a cyanate group, an isocyano group, an isocyanato-nitrooxy group, a cyano group, a nitrosooxy group, a nitroso group, a pyridyl group, and/or a carboxsulfinic acid group, a sulfonic acid group, a thiocyanato group, a mercapto group, a sulfanyl group, a sulfinyl group, a sulfo group, a sulfonyl group, an isothiocyanato group and/or a disulfide group. Phosphorus-containing groups that may sequester an element and/or molecule include at least one of a phosphonic group, a phosphate group, a phosphoryl group, a phosphono group, a phosphor group, and/or a phosphoryl group. Carbon-containing groups that may sequester a metal include at least one of a C—OH group (carbon hydroxyl group), a carbonyl group, a carboxylate group. Silicon-containing groups that may sequester a metal include at least one of a silicate group, a siliconate group, a silane group, or a siloxane.

In some embodiments of the present disclosure, a sequestering material may include a compound having a structure defined by

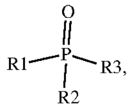

where at least one of $R_1$, $R_2$, and/or $R_3$ comprise at least one of hydrogen, oxygen, and/or carbon. For example, at least one of $R_1$, $R_2$, and/or $R_3$ may include at least one of an oxygen-containing group, a hydroxyl group, and/or an alkyl group.

In some embodiments of the present disclosure, a sequestering material may include a compound having a structure defined by

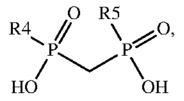

where at least one of $R_4$ and/or $R_5$ comprise at least one of hydrogen, oxygen, and/or carbon. For example, at least one of $R_4$ and/or $R_5$ may include at least one of an oxygen-containing group, a hydroxyl group, and/or an alkyl group.

In some embodiments of the present disclosure, a sequestering material may include a compound having a structure defined by

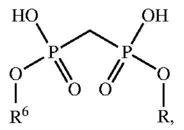

where at least one of $R^6$ and/or R comprise at least one of hydrogen, oxygen, and/or carbon. For example, at least one of $R^6$ and/or R may include at least one of an oxygen-containing group, a hydroxyl group, and/or an alkyl group.

In some embodiments of the present disclosure, a composition for sequestering an element and/or molecule may include P,P'-di(2-ethylhexyl)methanediphosphonic acid (DMDP) having a structure defined by

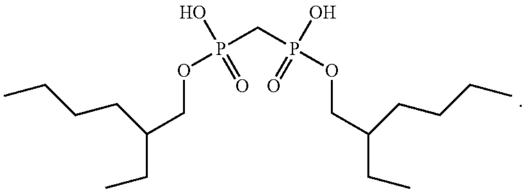 [SMILES: CCCCC(CC)COP(=O)(O)CP(=O)(O)OCC(CC)CCCC]

In some embodiments of the present disclosure, a composition for sequestering an element and/or molecule may include N,N,N',N'-ethylenediaminetetrakis(methylenephosphonic acid) (EDTMP) having a structure defined by

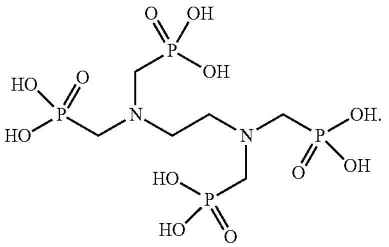 [SMILES: O=P(O)(O)CN(CCN(CP(=O)(O)O)CP(=O)(O)O)CP(=O)(O)O]

In some embodiments of the present disclosure, a sequestering material may include at least one of P,P'-di(2-ethylhexyl)methanediphosphonic acid (DMDP) and/or N,N,N',N'-ethylenediaminetetrakis(methylenephosphonic acid) (EDTMP). Other sequestering compositions that fall within the scope of the present disclosure include at least one of dimercaptosuccinic acid (DMSA), ethylenediaminetetraacetic acid (EDTA), nitrilotriacetic acid (NTA), ethylenediaminedisuccinic acid (EDDS), iminodisuccinic acid (IDS), methylglycine diacetic acid (MGDA), L-Glutamic acid N,Ndiacetic acid (GLDA), 2-hydroxyethyliminodiacetic acid (HEIDA), ethylenediamine-N,N'-dimalonic acid (EDDM), ethylenediamine-N,N'-diglutaric acid (EDDG), 3-hydroxy-2,2-iminodisuccinic acid (HIDS), and/or 2,6-pyridine dicarboxylic acid (PDA), poly ethylene glycol (PEG), poly vinyl alcohol, poly vinyl pyrrolidone and cellulose-based materials.

As shown herein, experimental PSCs encapsulated in exemplary lead-sequestering tapes exhibited an SQE over 99.9% after three months of exposure to outdoor conditions, followed by exposure to severe acute physical damage (e.g., to simulate hail damage), and seven days of immersion in water. This SQE level renders a practical approach to mitigate the potential lead leakage to a level below EPA's latest regulation of lead content (U.S. Federal 86 FR 4282 regulation) in drinking water. Additionally, these lead-sequestering tapes can be fabricated as separate components, independent of the PSC fabrication.

Described herein are compositions designed for the easy application of metal-sequestering materials to perovskite-containing devices at manufacturing scale on continuous manufacturing lines. In some embodiments of the present disclosure, a metal-sequestering tape may be utilized, in the form of a continuous sheet suitable for a continuous manufacturing process, e.g., a roll-to-roll process. In some embodiments of the present disclosure, a metal-sequestering tape may be provided with a metal-sequestering layer and a support layer, resulting in a bilayer (i.e., tape) of the metal-sequestering layer and the support layer. For solar cell applications, LEDs, etc., and where the tape is being applied to either the light receiving side and/or light emitting side of a device stack, the bilayer is at least partially transparent to light. In some embodiments of the present disclosure, a metal-sequestering tape may be substantially transparent to light having a wavelength greater than or equal to 350 nm.

In some embodiments of the present disclosure, a metal-sequestering layer may be capable of sequestering a metal that includes at least one of lead and/or tin. The metal-sequestering layer may have an absorption capacity for the metal between about 1E-2 g metal/$cm^2$ and about 1E 7 g metal/$cm^2$. In some embodiments of the present disclosure, the metal-sequestering layer may include P, P'-di(2-ethylhexyl)methanediphosphonic acid (DMDP), combined with a support layer constructed of ethylene vinyl acetate (EVA). In some embodiments of the present disclosure, the metal-sequestering material may include P, P'-di(2-ethylhexyl) methanediphosphonic acid (DMDP) and combined with a support material of ethylene vinyl acetate (EVA), where the combination forms a single layered tape capable of being applied to a solar cell and/or module on a continuous manufacturing process.

The metal-sequestering layer may have a thickness between about 0.1 μm and about 100 μm, or between about 1.0 μm and about 10 μm. The support layer may have a thickness between about 0.01 mm and about 10 mm, or between about 0.1 mm and about 1.0 mm. In some embodiments of the present disclosure, the bilayer may be flexible, so as to enable it to be wound on a roll and/or tube, for shipment and/or use in roll-to-roll process. A single layer tape, where the single layer includes both the sequestering material and the support material, may have a thickness between about 0.1 μm and about 100 μm, or between about 1.0 μm and about 10 μm. Also, to accommodate, a roll-to-roll process, a metal-sequestering bilayer tape may be in the form of a sheet having a width between about 0.1 meter and about 2 meters and a length between about 0.1 meters and about 1,000 meters. The sheet may be positioned on a tube having a width about equal to the width of the sheet, with the tube configured to be used in a roll-to-roll manufacturing process.

Therefore, an aspect of the present disclosure is a roll-to-roll and/or sheet-to-sheet manufacturing process that includes a first system for depositing a perovskite stack onto a continuously moving substrate and a second system for depositing a tape, as defined herein, onto at least one of the substrate and/or the perovskite stack. In some embodiments of the present disclosure, a substrate may be constructed of a glass, a metal, and/or a plastic, where the substrate may be flexible or rigid. Examples of suitable plastic substrates include polyethylene terephthalate (PET) and polypropylene (PEN). In some embodiments of the present disclosure, solar cell devices that incorporate metal-sequestering tapes like those described herein may be manufactured in a continuous roll-to-roll process, where each layer (one or more) of the solar cell device is deposited using a liquid-processing step. Examples of liquid-processing methods include at various coating techniques such as blade coating, slot-die coating, spray coating, inkjet printing, etc. In some embodiments of the present disclosure, one or more methods for depositing a layer of a solar cell device may include a vapor phase method. For example, in some embodiments of the present disclosure, a metal electrode (silver, gold, copper, and/or molybdenum) may be deposited by thermal evaporation method and/or a sputtering method. In some embodiments of the present disclosure, each layer of a solar cell device may be deposited sequentially in a roll-to-roll process, with a station assigned for each layer, e.g., a first station for depositing an electron transport layer (ETL) onto a substrate, a second station for depositing a perovskite sequestering layer onto the ETL, a third station for depositing a hole transport layer (HTL) onto the perovskite sequestering layer, etc. Each station may be configured with a method suitable for depositing its specific layer/material, for example, including at least one of a liquid-deposition method or a vapor-phase deposition method.

Figure 4:
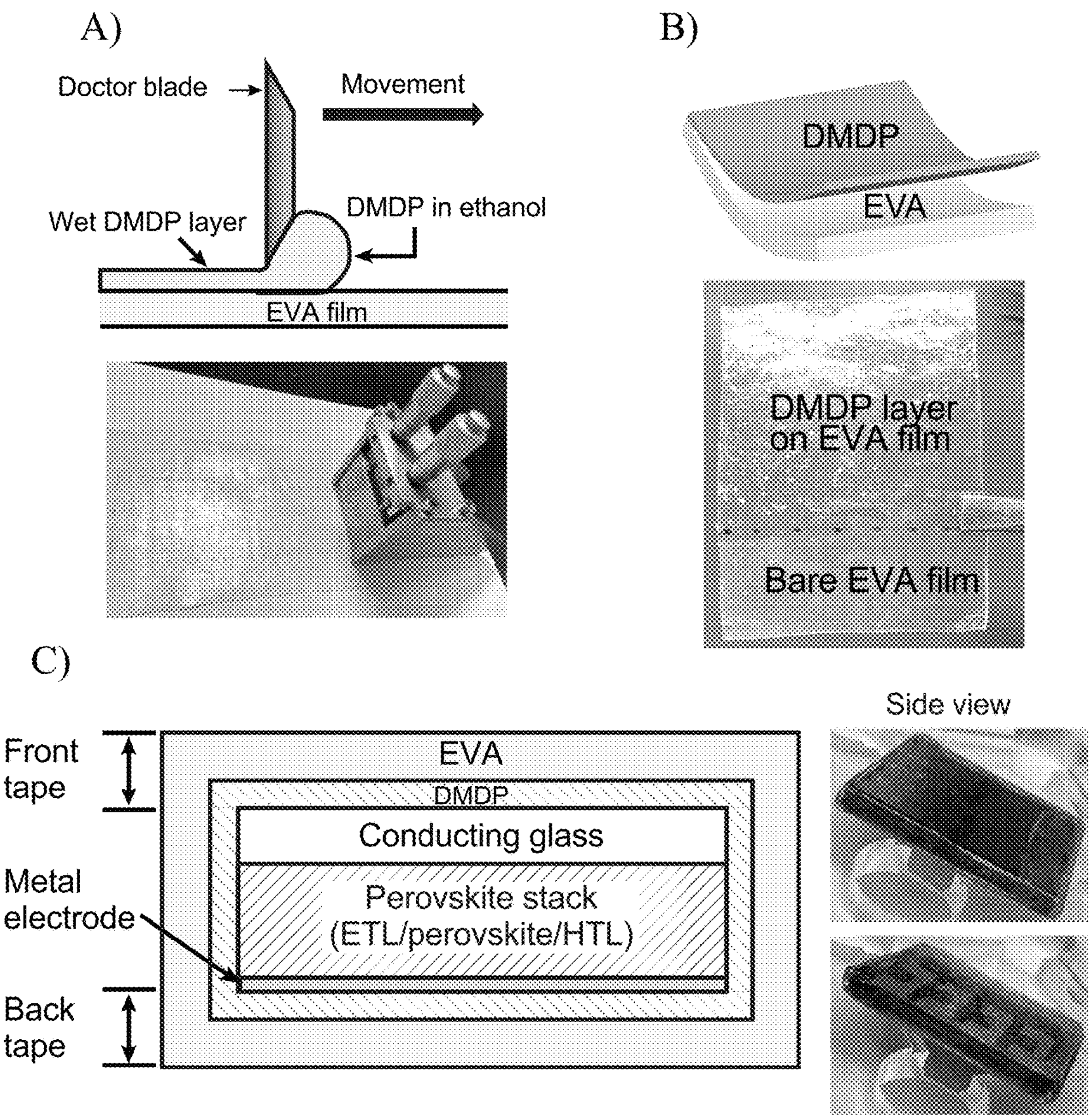
FIG. 4 illustrates a method for lead-absorbing tape fabrication and device integration, according to some embodiments of the present disclosure. Panel A illustrates a diagram of doctor-blading technique for applying a solution of P,P'-di(2-ethylhexyl)methanediphosphonic acid (DMDP) in ethanol onto an ethylene vinyl acetate (EVA) layer (top) and a photograph of the doctor-blading process (bottom). Panel B illustrates the resultant composition of a DMDP-laminated EVA tape (top) and a photograph of a DMDP-laminated EVA tape (bottom). Panel C illustrates a schematic of the encapsulation of a perovskite solar cell (PSC) on both sides with a DMDP-laminated EVA tape (left) and photographs of the actual encapsulated PSC devices (right) after exposure to a mild heat treatment.
Figure 5:
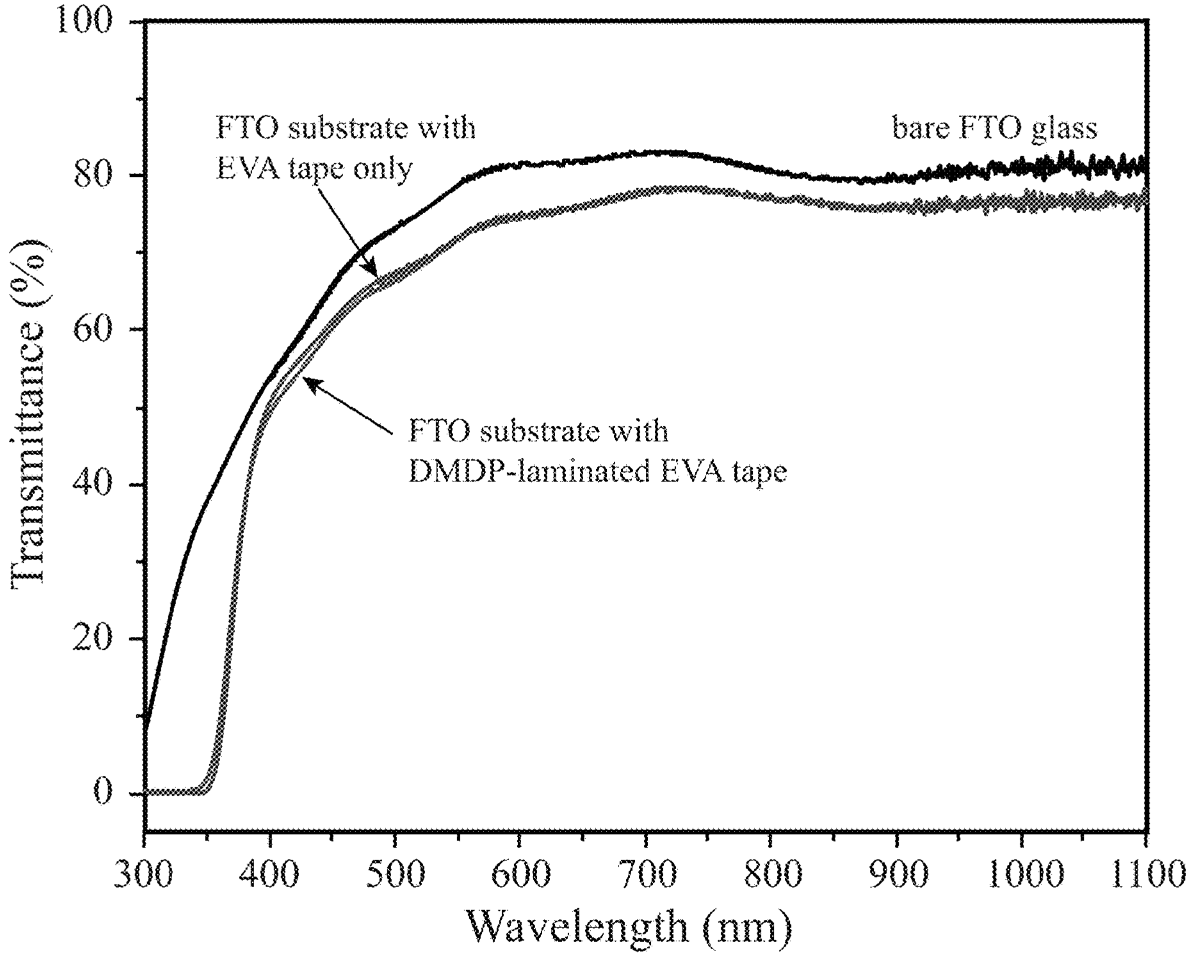
FIG. 5 illustrates the optical transmittance of bare FTO glass, FTO glass with an EVA layer, and FTO glass with a DMDP-laminated EVA tape, according to some embodiments of the present disclosure.

The general process of preparing the lead-sequestering tapes described herein, and their application to encapsulate standard PSCs, is illustrated in FIG. 4, which illustrates drawings of the various steps and devices paired with photographs of actual examples of each step. In brief, referring to Panel A of FIG. 4, an ethanol solution of DMDP (0.57 M) was first doctor-bladed onto a layer of EVA, followed by solvent evaporation under ambient conditions. Upon mild heating (e.g., up to about 45° C.), this DMDP-laminated EVA tape can turn transparent as shown in Panel B of FIG. 4. Thus, referring now to Panel C of FIG. 4, for the application of the lead-sequestering tape onto the frontside of a PSC, the tape is in contact with and bound to a glass surface of the PSC, and, due to the transparency of DMPS, does not to affect, or only marginally affects, the normal PSC's performance. These negligible impacts are verified in FIGS. 12A-12E. Referring again to Panel C of FIG. 4, on the backside, the DMDP side of the DMDP-laminated EVA layer is in physical contact with the metal electrodes after mild heat treatment. In this example, the thickness of the DMDP layer on the glass side was about 5.7 μm, which is equivalent to about $1.50\times10^{-6}$ mol DMDP/$cm^2$. This amount was estimated to have the capacity to absorb up to $3.11\times10^{-4}$ g/$cm^2$ of lead, approximately 3.9 times higher than the total lead contained in the exemplary PSCs tested (the PSC lead content was about $8.07\times10^{-5}$ g/$cm^2$). For the back metal electrode side, an EVA layer laminated with 10-μm-thick DMDP layer was used, corresponding to a lead-sequestering capacity a factor of about 6.7 times the total lead contained in the exemplary PSC device being tested. Note that the phosphonic group in DMDP is a derivative of phosphate, an anion characterized by having a very low solubility product equilibrium constant ($K_{sp}=8.0\times10^{-43}$) with $Pb^{2+}$ cations. FIG. 5 shows that the transmittance profile of FTO glass covered only by an EVA layer nearly overlaps that of FTO glass covered by DMDP-laminated EVA tape, indicating that the DMDP layer imposes no negative effect on transmittance.

Figure 6A:
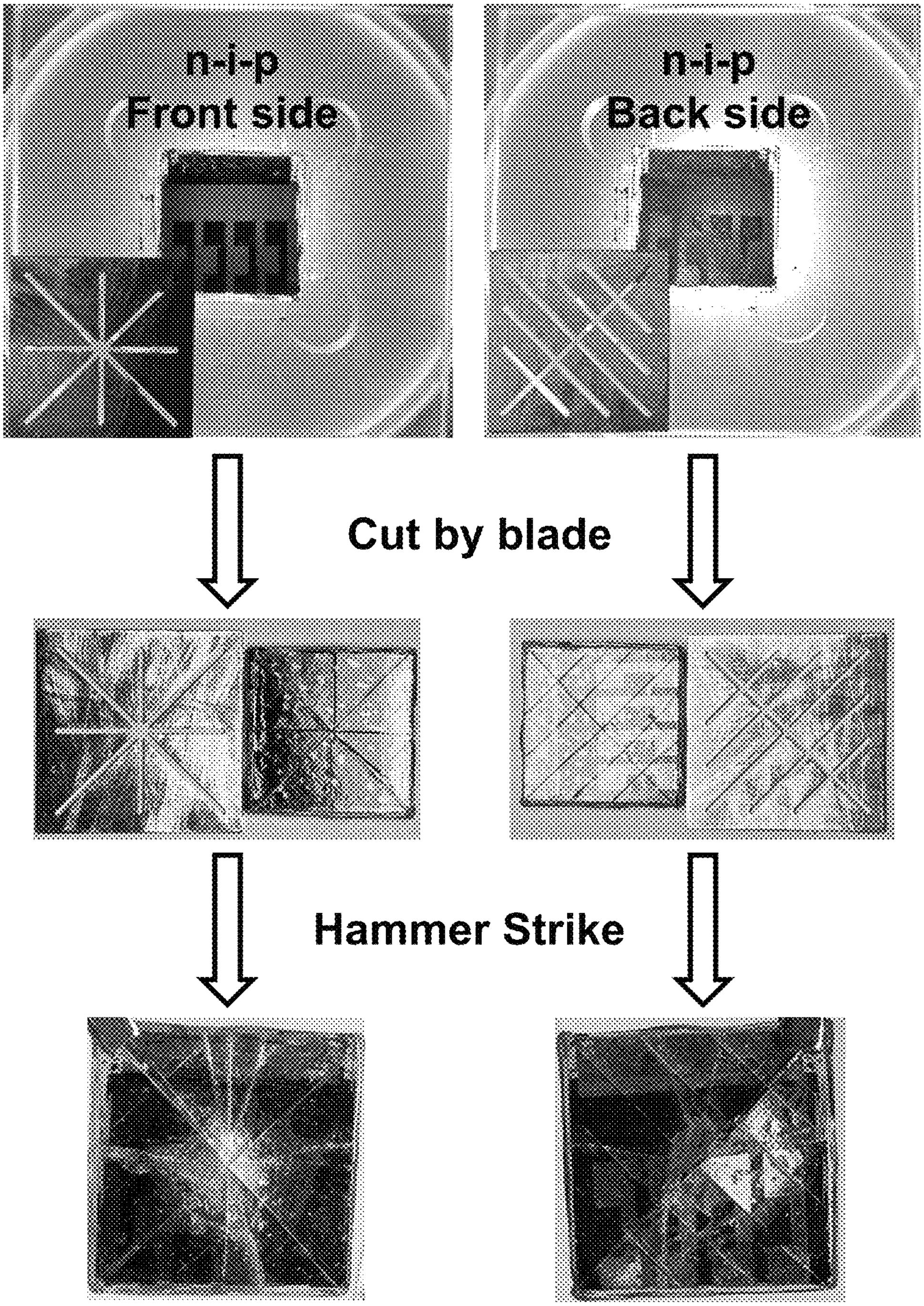
FIG. 6A illustrates photographs of the method used herein to consistently and repeatedly damage n-i-p PSCs encapsulated by DMDP-laminated EVA tapes for subsequent metal sequestration experiments, according to some embodiments of the present disclosure. Encapsulated PSCs positioned in a sample holder were cut with the guidance of cutting masks for both the front and back sides (inset of the top photographs), followed by damaging the TCO glass substrates by a hammer strike.

To validate the general lead-sequestering effectiveness of the exemplary lead-sequestering tapes constructed of DMDP-laminated EVA layers, two types of PSC configurations were tested; n-i-p and p-i-n. n-i-p devices were configured using the following stack architecture: fluorine-doped tin oxide (FTO)/$TiO_2$/perovskite/Spiro-OMeTAD/Au (corresponding to first contact/ETL/absorber layer/HTL/second contact). p-i-n devices were configured using the following stack architecture: indium doped tin oxide (ITO)/PTAA/perovskite/$C_{60}$/BCP/Ag (corresponding to first contact/HTL/absorber layer/ETL/second contact). The perovskite compositions for the n-i-p and p-i-n devices were $Cs_{0.05}FA_{0.81}MA_{0.14}PbI_{2.57}Br_{0.43}$ and $Cs_{0.05}FA_{0.8}MA_{0.15}PbI_{2.55}Br_{0.45}$, respectively. Each stack was positioned between DMDP-laminated EVA layers, i.e., lead-sequestering tapes, on both the front and back surfaces of the PSCs. Control devices positioned between EVA layers lacking the lead-sequestering DMDP layers. Note that all the device sizes were about one square inch in surface area. To mimic the worst-case scenario capable of maximizing lead leakage from the PSCs, both sides of each PSC were significantly damaged using a standardized process as illustrated in FIGS. 6A (n-i-p device) and 6B (p-i-n device).

Figure 6B:
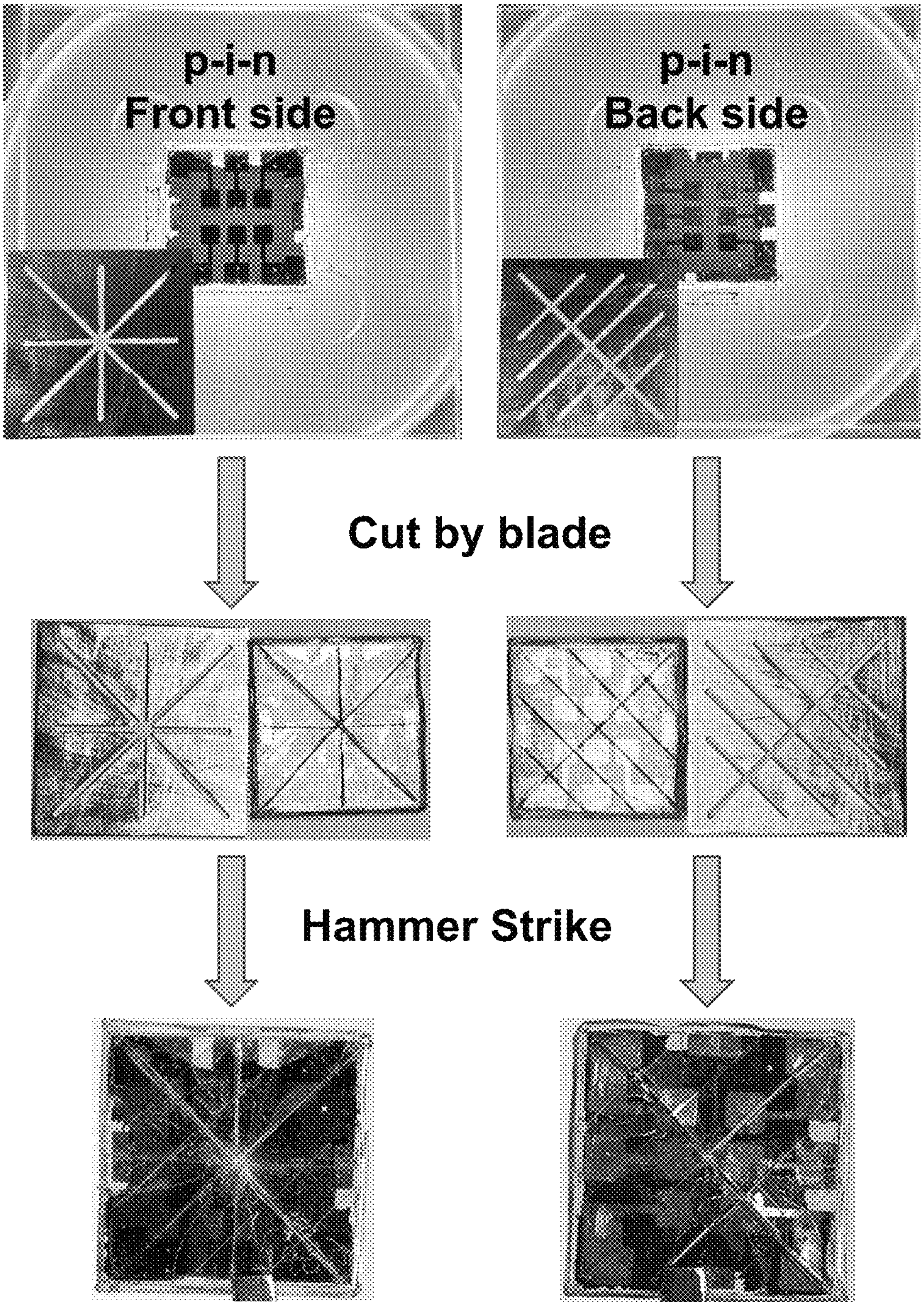
FIG. 6B illustrates the same procedure as described for FIG. 6A but completed on a p-i-n PSC encapsulated by DMDP-laminated EVA tapes, according to some embodiments of the present disclosure.
Figure 7:
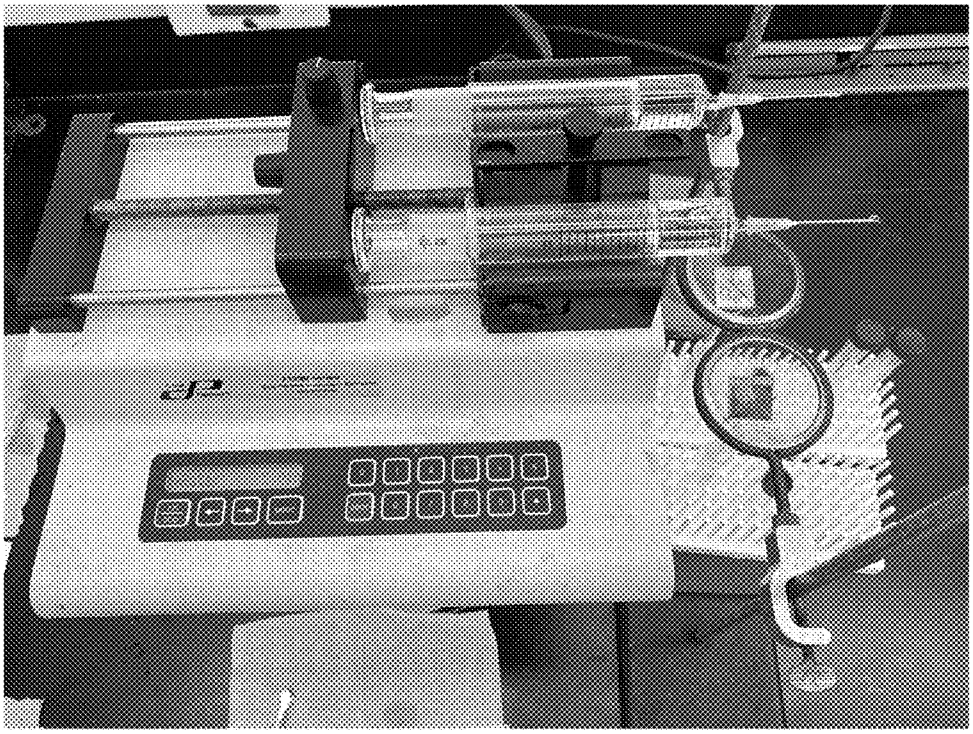
FIG. 7 illustrates (Panel A) a photograph of water drip test set-up used to simulate rainfall in the studies described herein. Damaged devices were exposed to a flow of water supplied by a syringe pump to simulate rainfall conditions. The bottom photographs illustrate encapsulated n-i-p devices (Panel B left) and p-i-n devices (Panel B right) after exposure to water-drip tests, according to some embodiments of the present disclosure.
Figure 7:
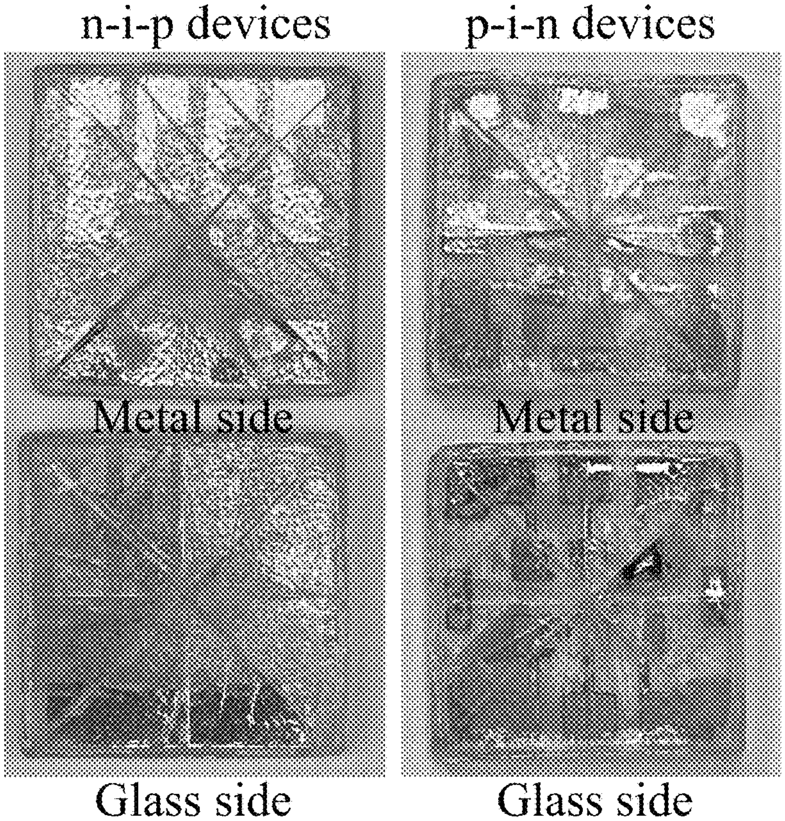

Referring to Panel A of FIG. 7, a simulated rainfall test was conducted to mimic a dynamic rainfall on the PSCs. The damaged devices (per the methods illustrated in FIGS. 6A and 6B) were placed (with the front FTO glass face facing up) while positioned at the narrow portion of a glass funnel and tilted 30° from horizontal to enable water to flow over and off the surface of the PSCs. Acidic water (pH at about 4.2 titrated by $HNO_3$ to mimic acidic rain) was supplied by a syringe pump, which was positioned about 16 cm above the PSC positioned at the 30° angle within the funnel. The acidic water would then fall the 16 cm to impinge upon the upward facing, tilted surface of the PSC at a rate of about 5 mL/h for each device tested (see Panel A of FIG. 7). The lead containing water, i.e., effluent, that flowed through the damaged devices were collected (estimated to about 90% of the total water passing into and through the devices), and the corresponding effluent lead concentrations were analyzed by flame atomic absorption spectroscopy (FAAS) for relatively high lead concentrations of greater than or equal to 0.8 ppm, and by inductively coupled plasma mass spectrometry (ICP-MS) for relatively low lead concentrations of less than 0.8 ppm. Each PSC's protective glass front surface was so significantly damaged that the water could contact and flow through essentially the entirety of each device, as indicated by a drastic color change of the perovskite materials from black to yellow/transparent (see photos illustrated in Panel B of FIG. 7). Note that due to the significantly smaller size of the devices tested compared to full-scale modules, the relative damaged area of the test devices was much greater than what would be expected in modules subjected to the impact density resulting from a destructive hailstorm (~1 impacts/$inch^2$). Thus, the tests conducted herein were more rigorous and the conditions under which the lead-sequestering tapes had to perform much more severe when compared to the conditions full-scale modules would be subjected to in the field.

Figure 8A:
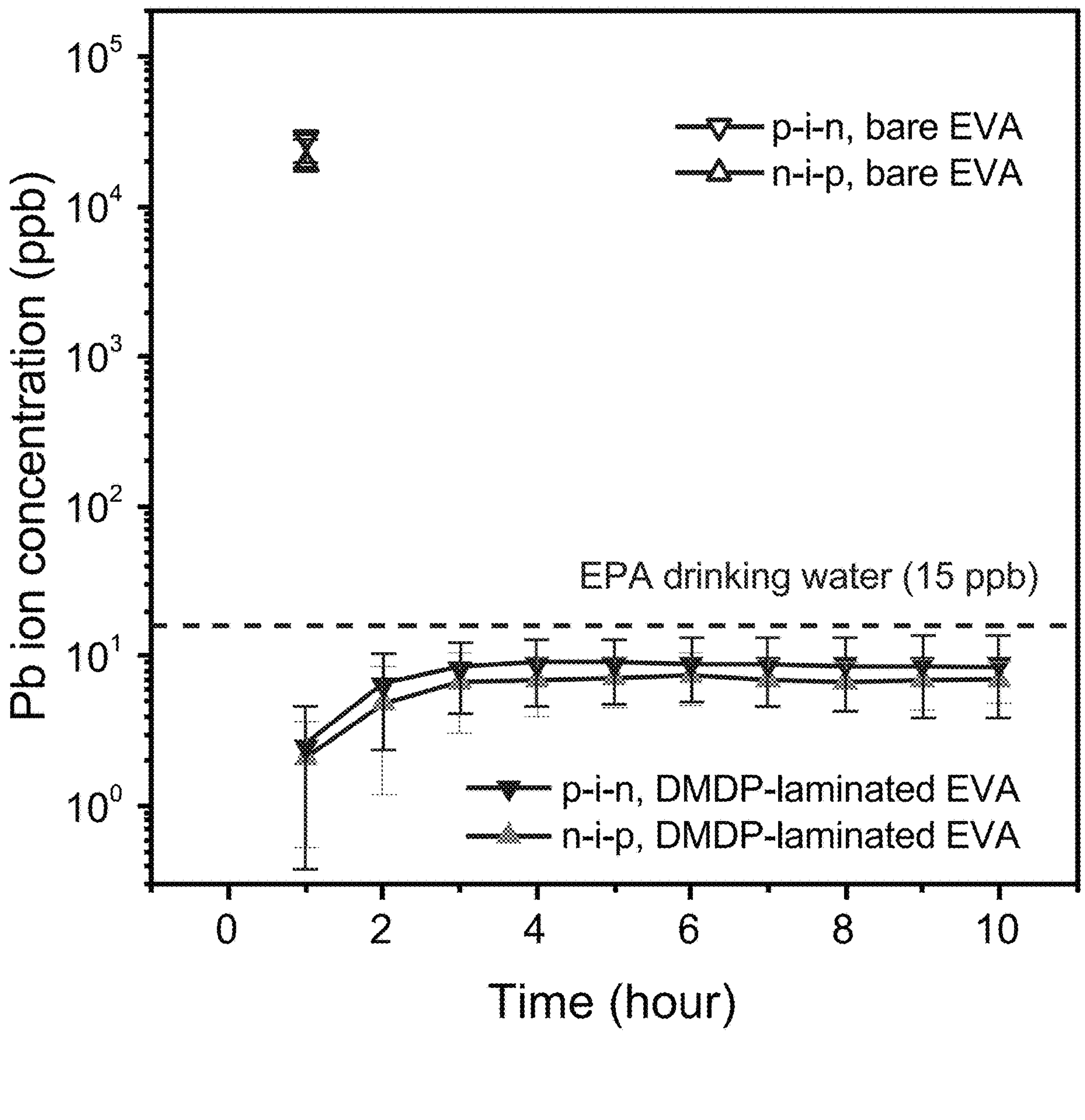
FIGS. 8A, 8B, and 8C illustrate lead leakage/leaching test results from PSC solar cells after being damaged according to the method illustrated in FIGS. 6A and 6B and subjected to simulated rainfall experiments by the method illustrated in FIG. 7.

FIG. 8A illustrates that the average lead concentration of effluent water collected from the damaged n-i-p devices with bare EVA tape (i.e., no DMDP layer) for one hour of simulated rainfall was approximately 19.14 ppm lead. In contrast, when using the lead-sequestering tape (DMDP layer/EVA layer bilayer tape), the lead concentration was substantially lower at only 2.13 ppb, after one hour. There was also a dramatic reduction of the average lead leakage from p-i-n devices, changing from 28.88 ppm lead with bare EVA to 2.53 ppb lead with DMDP-laminated EVA after one hour of exposure to simulated rainfall. Regardless of the device configurations, encapsulation using a lead-sequestering tape constructed of DMDP-laminated onto an EVA tape exhibited a high lead-sequestering capability, with effluent water lead concentrations maintained to less than 3 ppb, far below the 15-ppb limit required for drinking water. The water drip-test was then extended to 10 hours for the damaged devices constructed with the lead-sequestering tape; both types of PSCs exhibited excellent long-term lead-sequestering performance by maintaining an accumulated lead concentration of about 10 ppb lead. Effluent samples were taken at specific time internals to determine the amount of lead leaching from the devices.

Figure 8C:
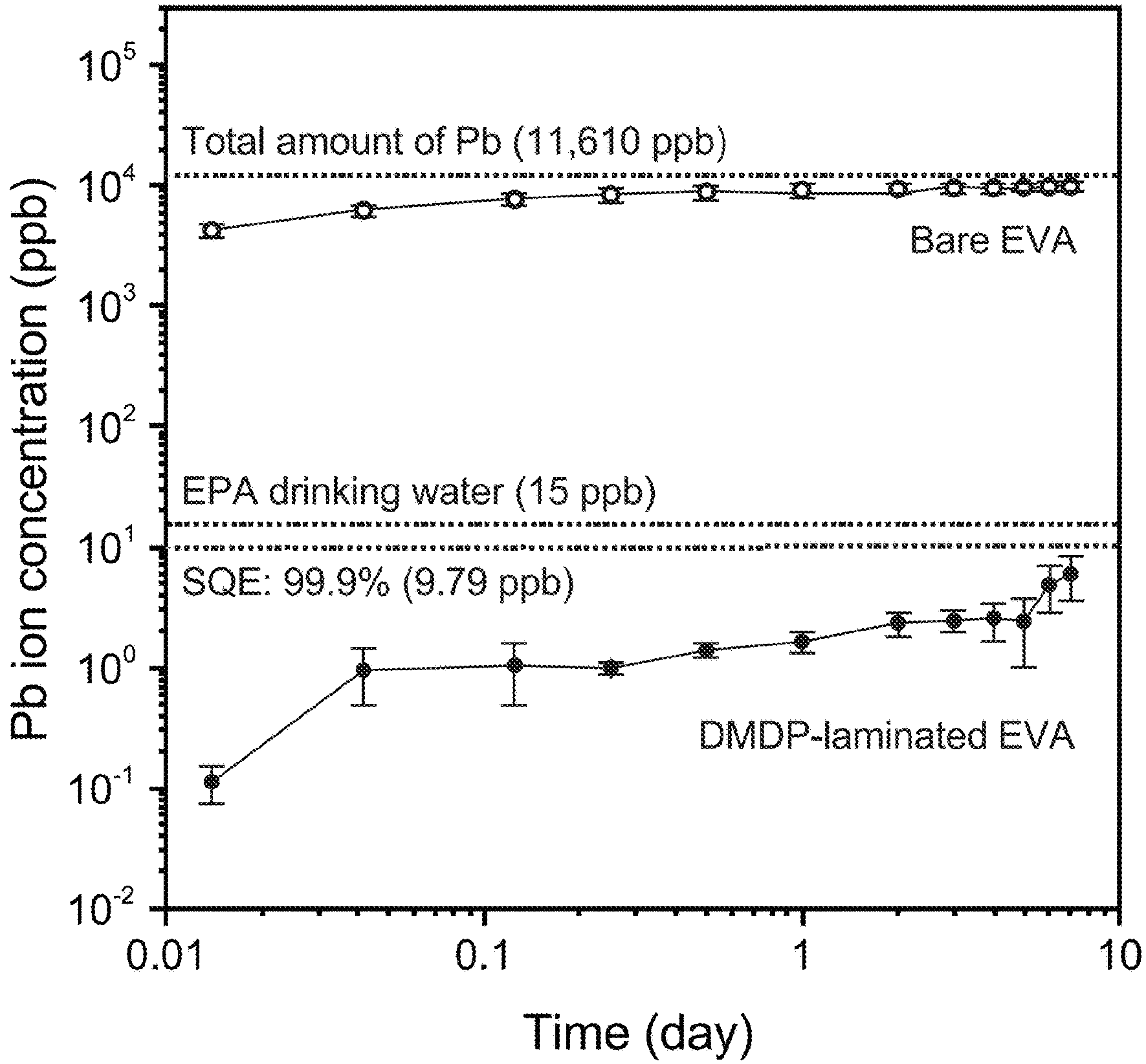
Figure 9:
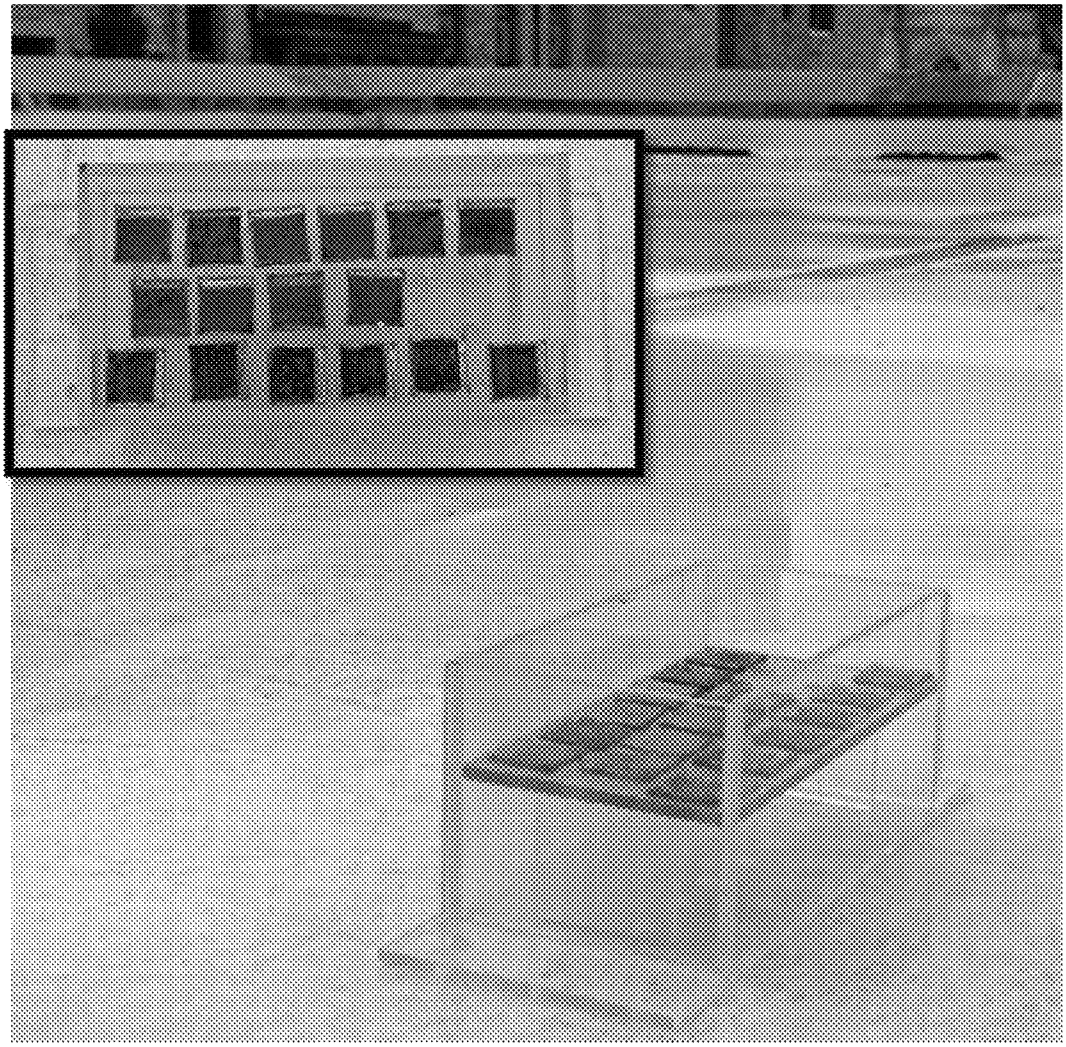
FIG. 9 illustrates photographs of the test apparatus used for outdoor exposure tests of encapsulated PSCs on rooftop configurations, as described herein.

Damaged devices immersed (i.e., soaked) in water represents another scenario that is likely to occur as a result of outdoor, full-scale implementation of PSCs in the field. To investigate the effectiveness of the lead-sequestering tapes described herein (e.g., DMDP-laminated EVA tapes) while immersed in water, damaged devices (p-i-n and n-i-p devices as described above) were immersed in 40 mL of pure water (approximately 10% of the total annual rainfall on our device area of 1 $inch^2$) for seven days to allow water to fully penetrate the entirety of the damaged devices. A period of seven days was chosen because a practical PV maintenance response time is about 3-7 days after a catastrophic event resulting in damage to solar modules (e.g., hail damage). In addition, the ability of DMDP-laminated EVA tapes to withstand outdoor conditions under normal operation was also tested. Thus, the PSC devices described above, protected with lead-sequestering tape, were tested for a duration of 3-months, during the summer on a rooftop (physically located in DeKalb, Illinois) (see FIG. 9) followed by immersion in water for over seven days. FIG. 8C illustrates a comparison of damaged n-i-p devices encapsulated either with bare EVA layers or with DMDP-laminated EVA tapes for seven days after immersion in the water. Remarkably, the lead concentration in the resultant water for devices covered with the DMDP-laminated EVA tapes remained below 12 ppb lead with a maximum value of only 11.75 ppb lead on day seven.

Figure 10A:
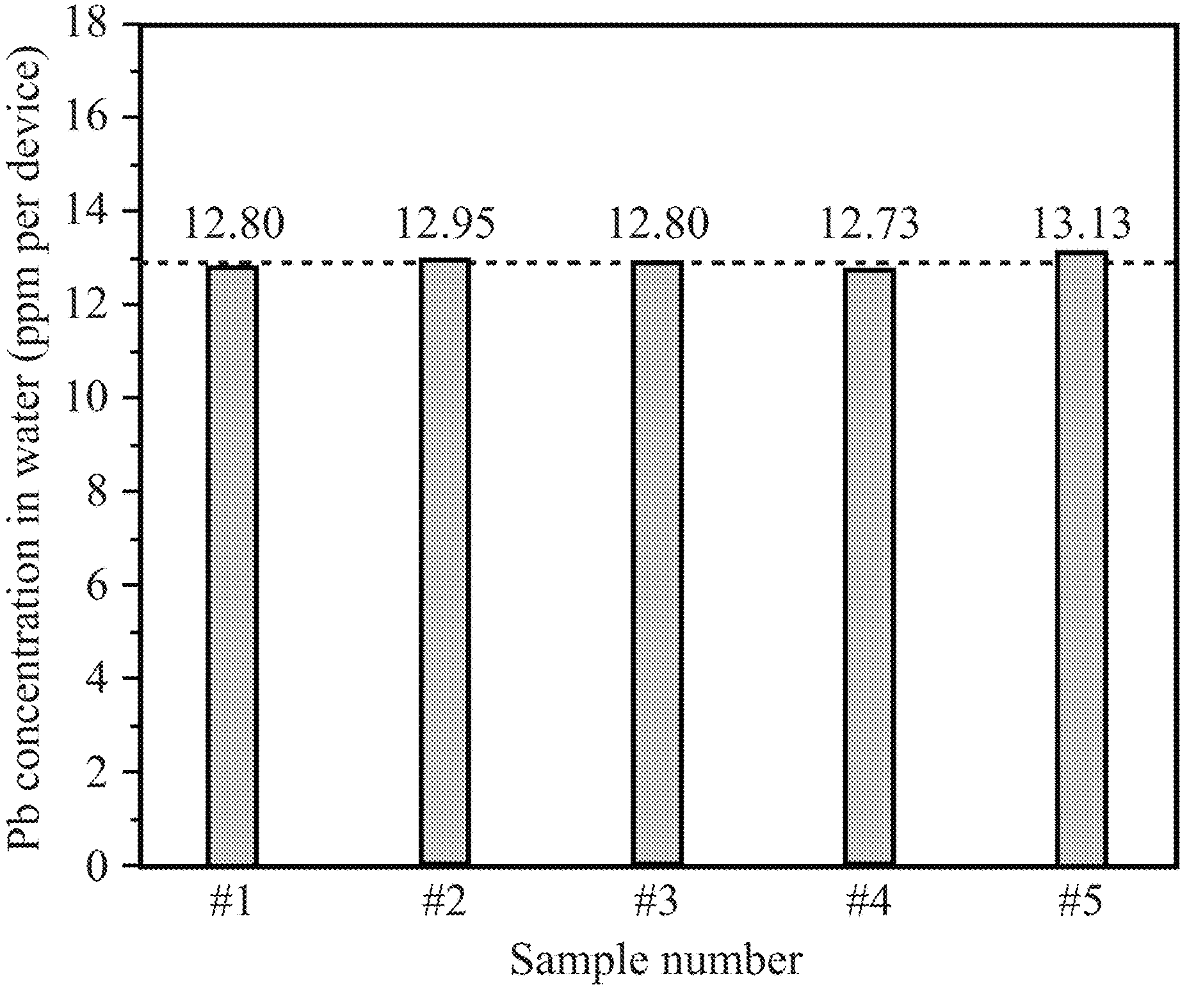
FIG. 10A illustrates lead concentrations of five n-i-p devices resulting from immersion in 40 mL water after a 3-month outdoor exposure test, according to some embodiments of the present disclosure. The dashed line indicates the lead amount calculated based on the density and thickness of the perovskite layers measured by a scanning electron microscope.

In contrast, the devices with only EVA resulted in lead concentrations of about 9.93 ppm, close to the theoretical concentration of 12.90 ppm if all of the lead initially present in the devices was removed, e.g., leached out (see FIG. 10A). These results suggest an SQE of 99.9% (see Equation 1 above), and less than the EPA restriction for lead in drinking water (15 ppb) can be achieved using the lead-adsorbing tapes described herein. So, the exemplary device tested herein without DMDP resulted in a 9.93 ppm lead leakage, which is the baseline value for calculating SQE. The exemplary device tested herein with DMDP was able to suppress the lead leakage to almost three orders of magnitude less, at about 15 ppb: SQE DMDP absorbed 1-(15 ppb/9.93 ppm)=99.9%. 7-day immersion tests were also conducted on p-i-n PSCs.

Figure 8B:
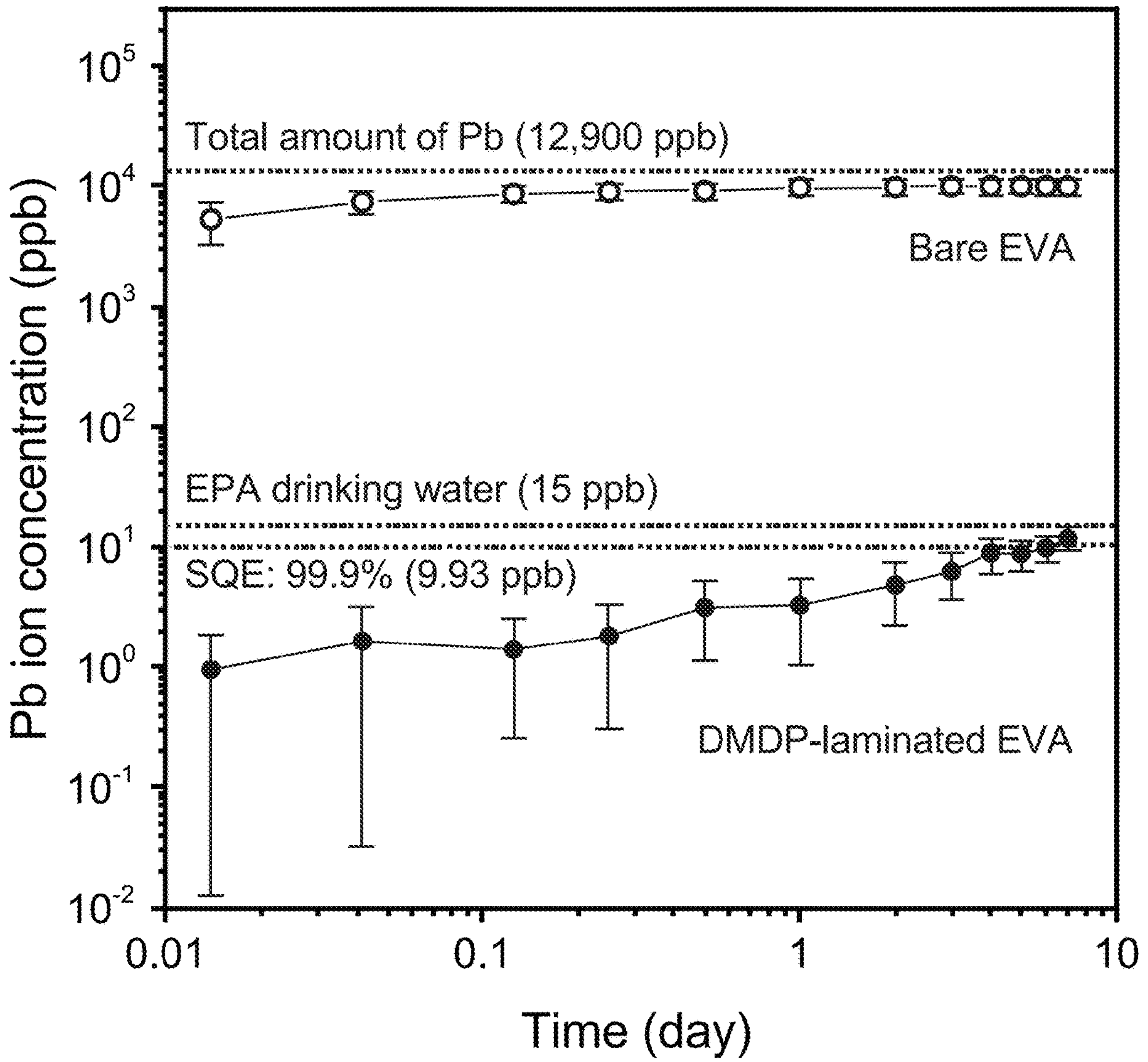
Figure 10B:
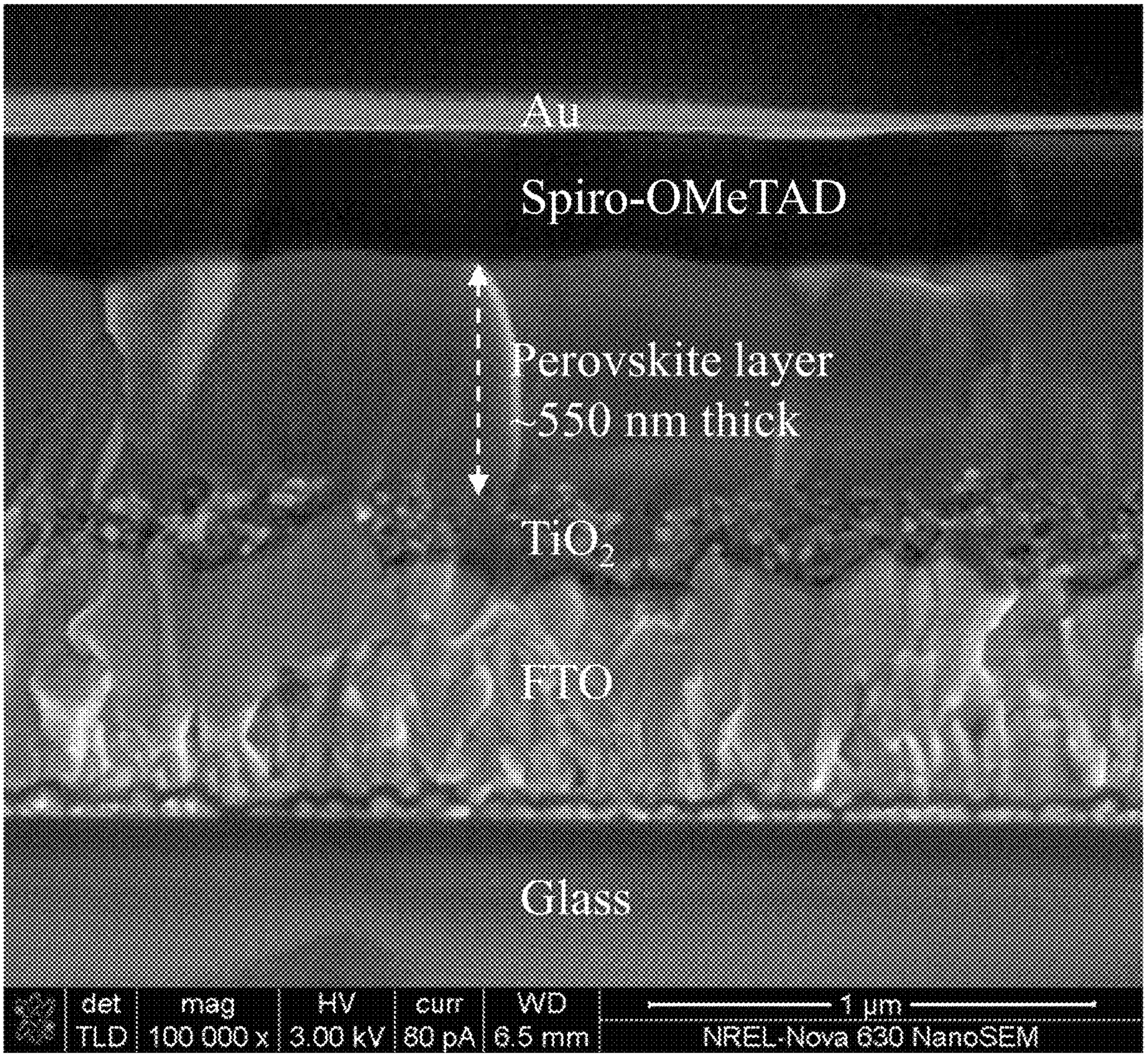
FIG. 10B illustrates an SEM cross-section image of an n-i-p PSC having a perovskite layer thickness of −550 nm and composition of $Cs_{0.05}FA_{0.81}MA_{0.14}PbI_{2.57}Br_{0.43}$, according to some embodiments of the present disclosure. The n-i-p device stack is consisted of glass/fluorine tin oxide (FTO)/$TiO_2$/perovskite/Spiro-OMeTAD/Au.
Figure 11A:
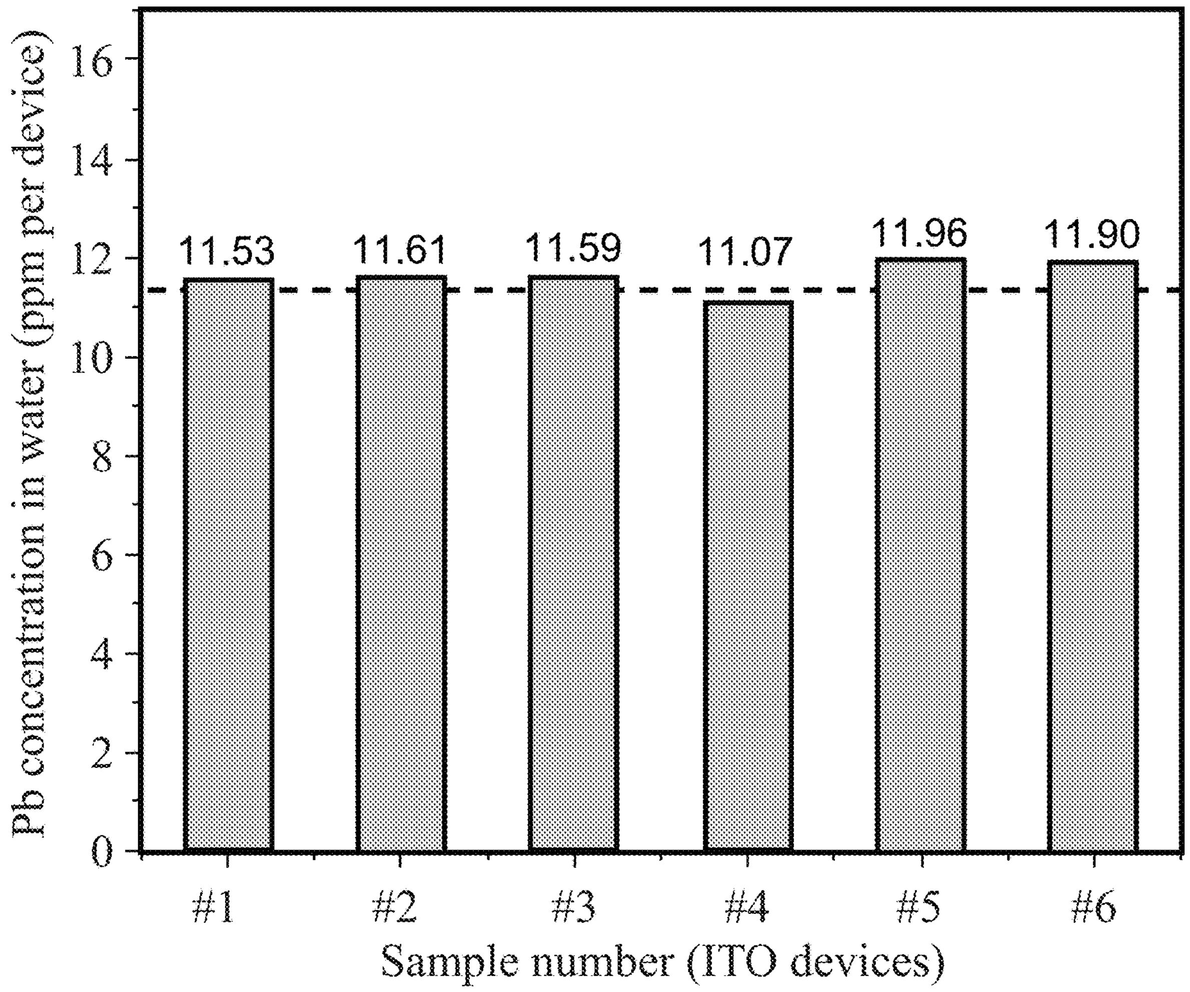
FIG. 11A illustrates lead concentrations of six p-i-n devices resulting from immersion in 40 mL water. The dashed line indicates the lead amount calculated based on the density and thickness of the perovskite layers measured by a scanning electron microscope.
Figure 11B:
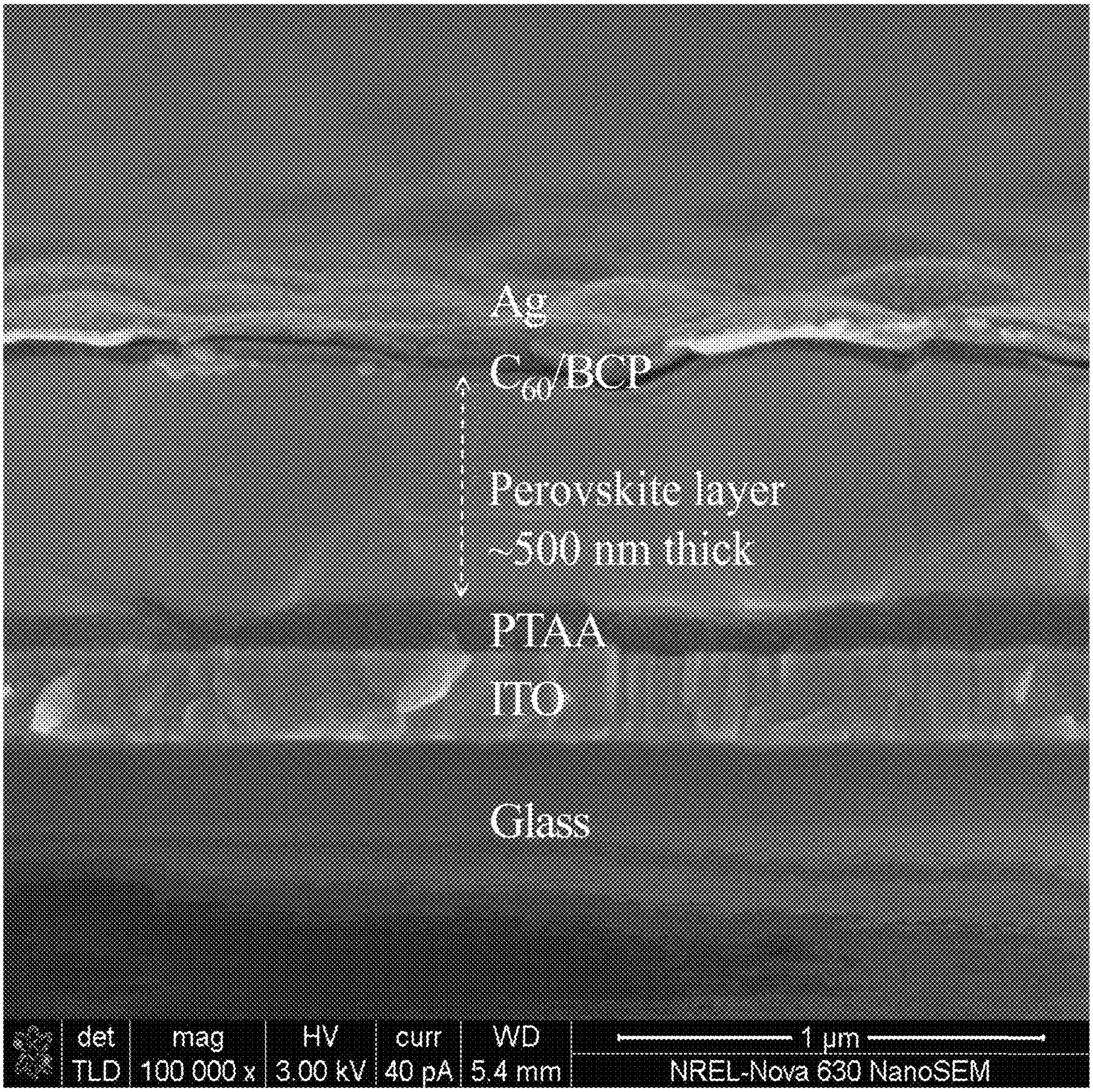
FIG. 11B illustrates an SEM cross-section image of p-i-n PSCs having a perovskite layer thickness of ~500 nm and composition of $Cs_{0.05}FA_{0.8}MA_{0.15}PbI_{2.55}Br_{0.45}$, according to some embodiments of the present disclosure. The p-i-n device stack is consisted of glass/indium tin oxide (ITO)/poly[bis(4-phenyl)(2,4,6-trimethylphenyl)amine (PTAA)/perovskite/$C_{60}$/bathocuproine (BCP)/Ag.
Figure 12A:
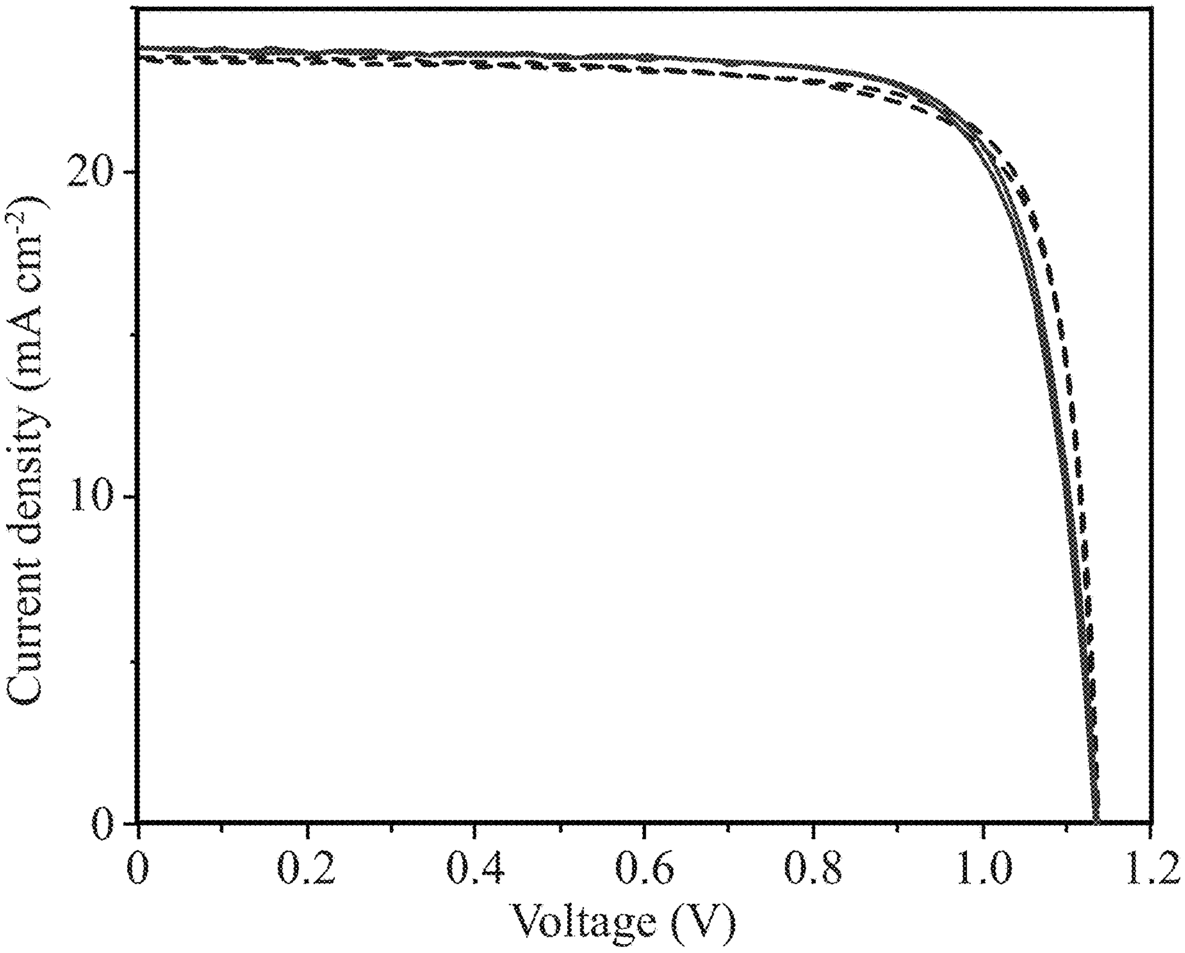
FIG. 12A illustrates J-V characteristics with stable power output (SPO) efficiency for bare PSCs, according to some embodiments of the present disclosure. (Bare PSC control—solid line; PSC with EVA layer only—dashed line.) These figures are summarized in Table 1.
Figure 12B:
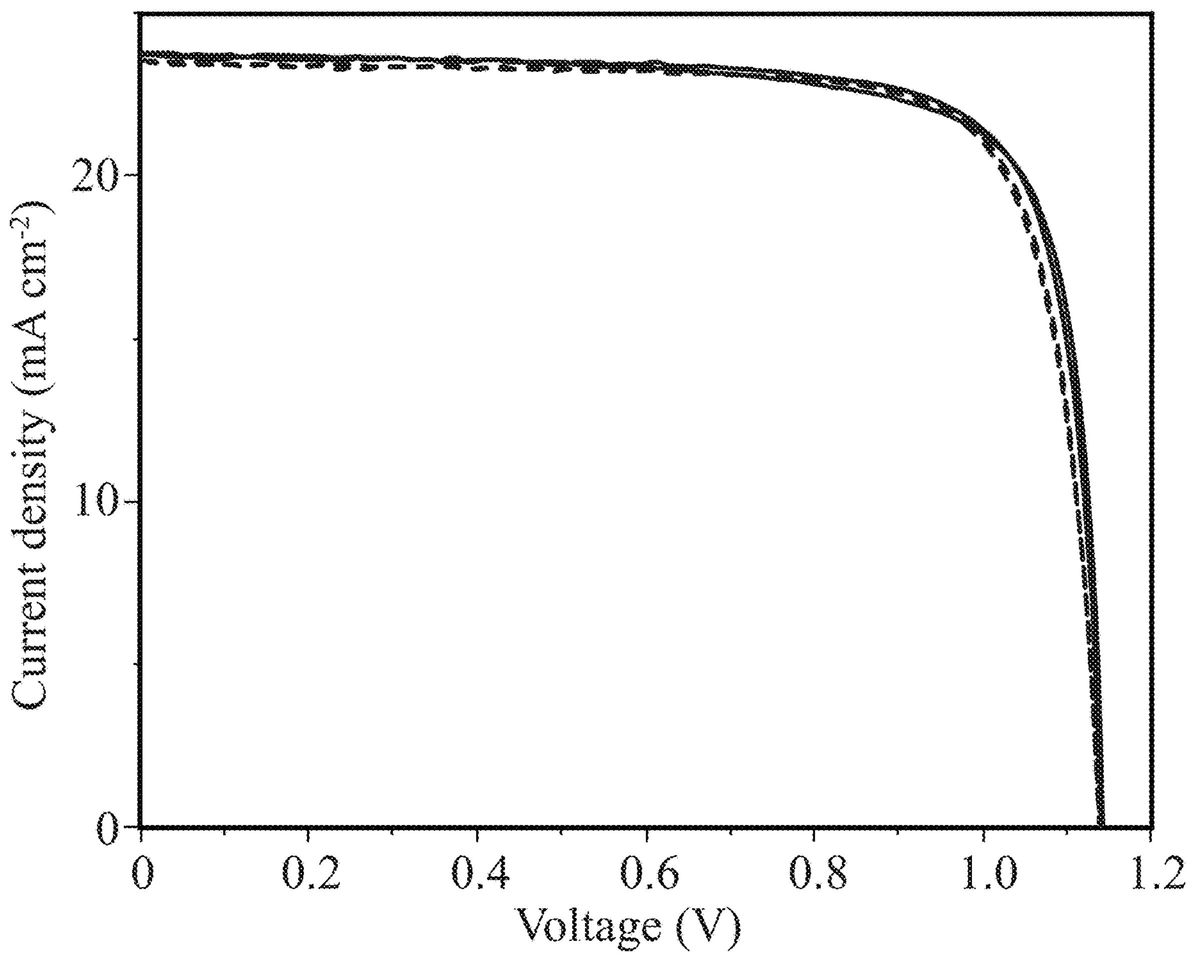
FIG. 12B illustrates J-V characteristics with stable power output (SPO) efficiency for PSCs protected with DMDP-laminated EVA tapes, according to some embodiments of the present disclosure. Bare PSC control—solid line; PSC with DMDP-laminated EVA tape—dashed line.) These figures are summarized in Table 2.
Figure 12C:
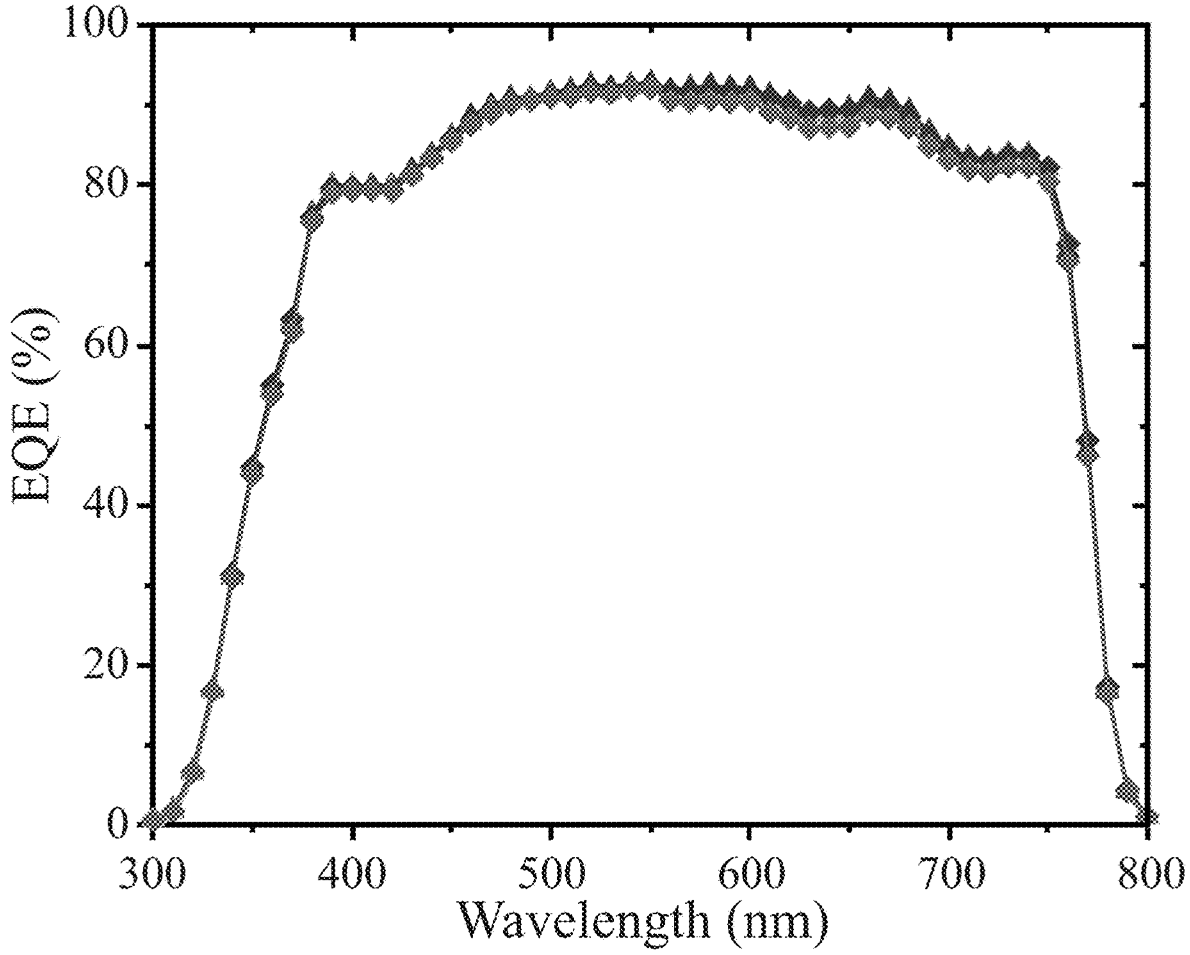
FIG. 12C illustrates EQE values for controls (bare PSC) (solid markers), EVA layer only (empty triangles), and PSCs protected with DMDP-laminated EVA tape (empty diamonds), according to some embodiments of the present disclosure. This figure indicates that the lead-sequestering tapes described herein have negligible impact on the EQE of perovskite solar cells that incorporate these tapes onto their frontside and backside.
Figure 12D:
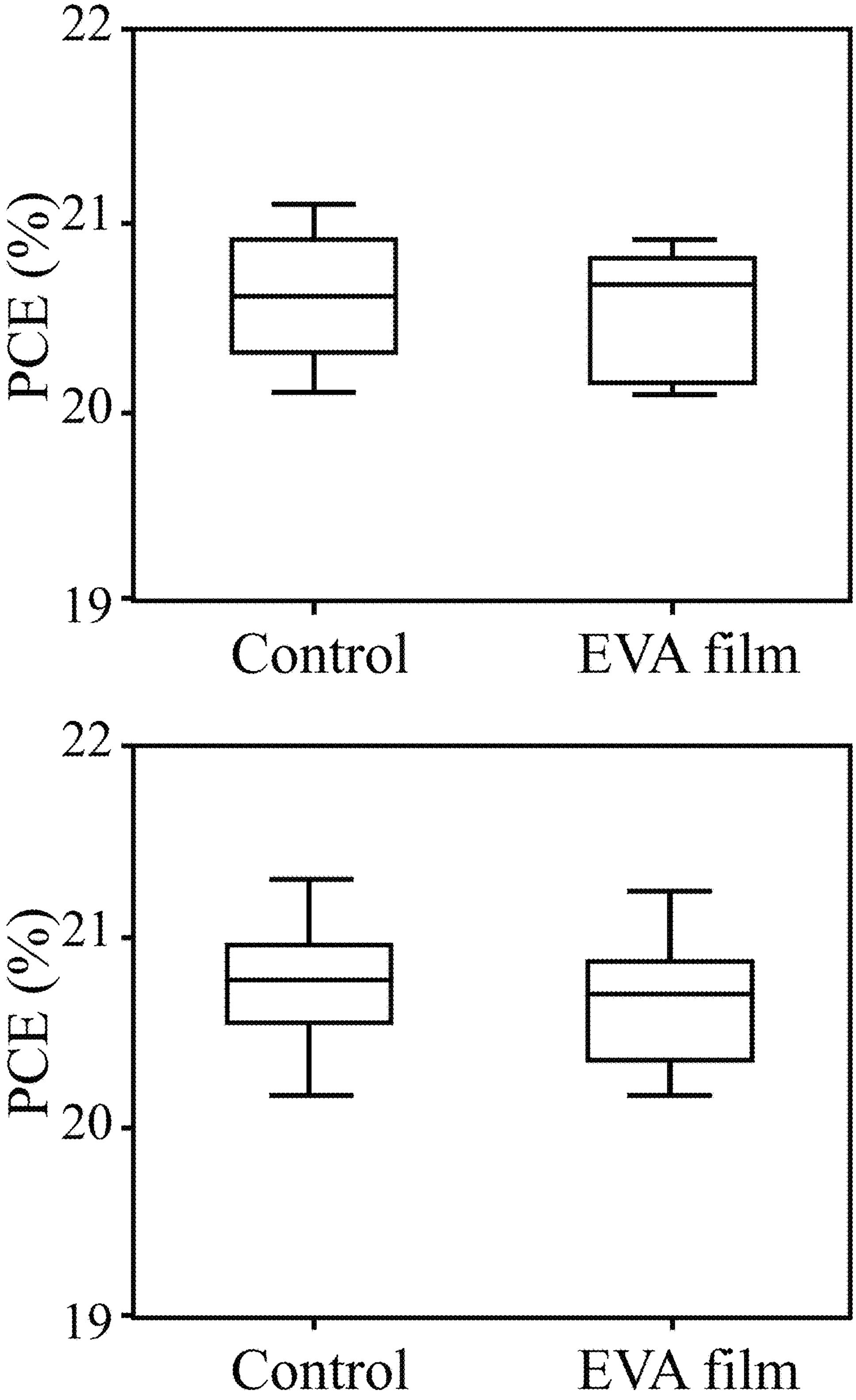
FIG. 12D illustrates PCE statistics for the devices described above for FIGS. 12A-12D, according to some embodiments of the present disclosure. These figures indicates that the lead-sequestering tapes described herein have negligible impact on the EQE of perovskite solar cells that incorporate these tapes onto their frontside and backside.
Figure 12E:
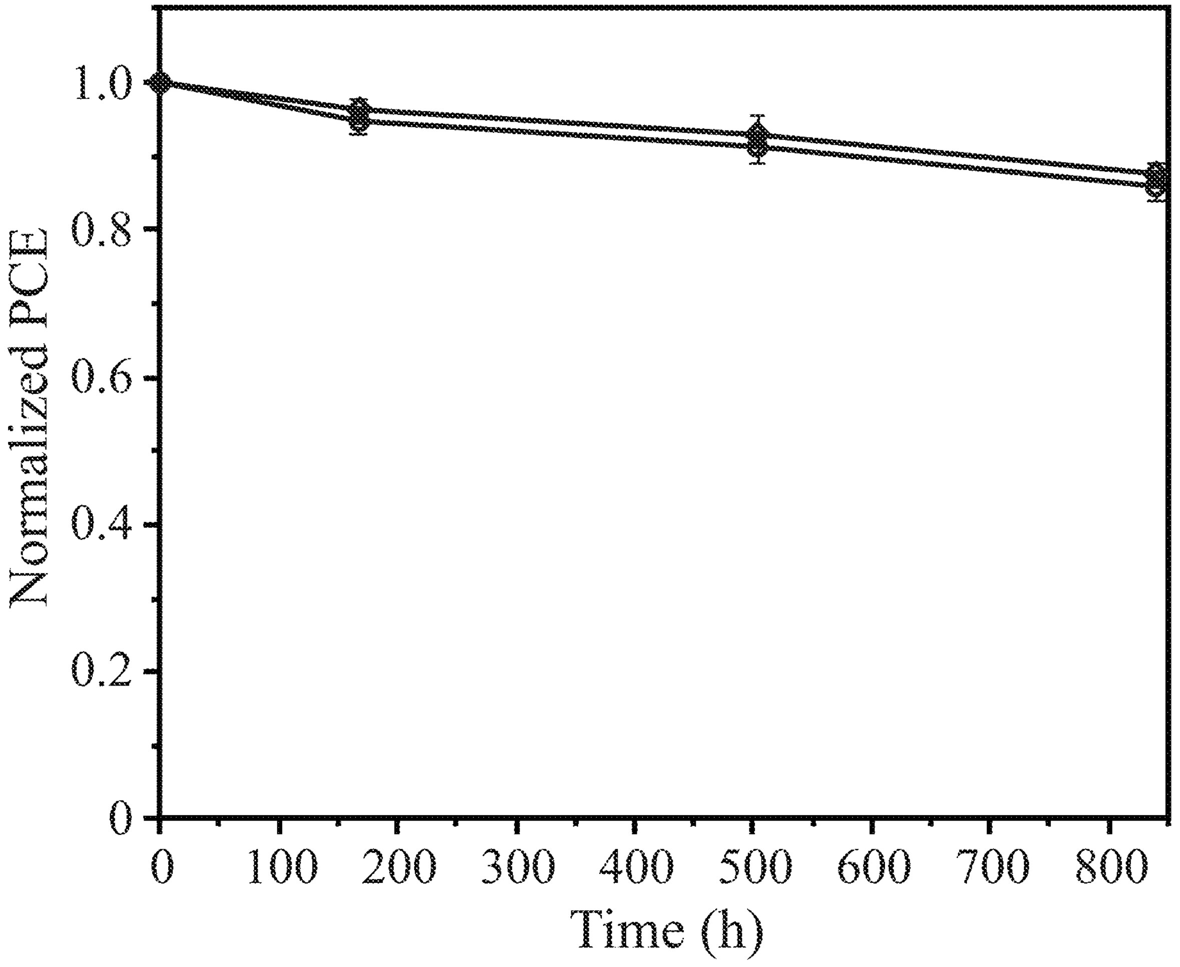
FIG. 12E illustrates a stability comparison of PSCs under dark at 55° C. in ambient condition (20-35% relative humidity), without encapsulation (circles) and with encapsulation (diamonds) using DMDP-laminated EVA tapes, according to some embodiments of the present disclosure. This figure indicates that the lead-sequestering tapes described herein have negligible impact on the EQE of perovskite solar cells that incorporate these tapes onto their frontside and backside.

FIG. 8B illustrates that the lead leakage from damaged p-i-n devices using only bare EVA tapes reached 9.79 ppm after seven days immersed, very close to the theoretical concentration of about 11.61 ppm if all of the lead present in the devices was to be removed from the devices and transferred into solution in the water (see FIG. 11A). In contrast, the lead leakage from damaged devices encapsulated with lead-sequestering tapes only reached 5.93 ppb after 7 days, corresponding to an SQE of over 99.9%. FIG. 10B shows the typical n-i-p device stack, consisting of glass/FTO/$TiO_2$/perovskite/Spiro-OMeTAD/Au (from the bottom to the top as indicated). FIG. 11B shows the typical p-i-n device stack, consisting of glass/ITO/PTAA/perovskite/$C_{60}$/BCP/Ag (from the bottom to the top as indicated). The thicknesses of the perovskite layers were used to calculate the theoretical amount of lead present, which enabled an estimate of the about of lead-sequestering material needed to sequester all of the lead present in the device.

Finally, the impact of the DMDP-laminated EVA tapes on the PV performance of PSCs was studied by using the n-i-p device stack in three different encapsulation conditions: no encapsulation, encapsulated just with EVA tapes and encapsulated with DMDP laminated EVA tapes. It was determined that lead-sequestering tape does not negatively impact either device efficiency or stability (see FIGS. 12A-E). Table 1 and Table 2 summarizes the metrics illustrated in FIGS. 12A-E. These results show the coating of either EVA or DMDP+EVA tape exhibits no negative impact on device efficiency and stability.

TABLE 1

PV metrics for devices using a tape containing only EVA

| Sample | $V_{oc}$ (V) | $J_{sc}$ (mA $cm^{-2}$) | FF | PCD (%) |
|---|---|---|---|---|
| Control (backward) | 1.138 | 23.80 | 0.769 | 20.83 |
| Control (forward) | 1.139 | 23.75 | 0.778 | 21.05 |
| EVA (backward) | 1.136 | 23.53 | 0.775 | 20.72 |
| EVA (forward) | 1.136 | 23.51 | 0.785 | 20.97 |

TABLE 2

PV metrics for devices using a tape containing EVA laminated with DMDP

| Sample | $V_{oc}$ (V) | $J_{sc}$ (mA $cm^{-2}$) | FF | PCD (%) |
|---|---|---|---|---|
| Control (backward) | 1.143 | 23.75 | 0.780 | 21.17 |
| Control (forward) | 1.141 | 23.68 | 0.789 | 21.31 |
| DMDP + EVA (backward) | 1.140 | 23.47 | 0.788 | 21.08 |
| DMDP + EVA (forward) | 1.139 | 23.43 | 0.795 | 21.22 |

In addition to solving the problem of metals (e.g., lead and tin) leaching into the environment from PSCs at their end-of-life, PSCs encapsulated in the metal-sequestering tapes described herein provide other benefits and advantages. For example, the metal-sequestering tapes described herein may the reduce or eliminate the probability of TCO glass layers shattering into dangerous glass shards, for example, due to an accidental drop of a PSC module during installation. This can help mitigate the risk of accidental injury during installation, making the use of tape-encapsulated PSCs possible for building integrated PV (BIPV). Currently, building PV applications require any glass installed above certain height be tempered glass. Therefore, the use of the metal-sequestering tapes described herein, for encapsulating PSCs, may help mitigate at least some of the risks associated with moving perovskite PV technology into the marketplace.

Materials and Methods:

Materials: All the chemicals were used as purchased without further purification unless otherwise noted. DMDP was obtained from Eichrom Technologies. Both FAI and MABr were purchased from Greatcell Solar. $PbI_2$ and $PbBr_2$ were purchased from TCL Spiro-OMeTAD was purchased from Merck Corporation. The titanium diisopropoxide bis (acetylacetonate), tert-butylpyridine, bis(trifluoromethanesulfonyl)imide lithium salt, cesium iodide (CsI) were purchased from Sigma-Aldrich. The solar-grade EVA layers were from Amazon. The glass substrates with patterns of FTO and ITO were obtained from Advanced Election Technology Co., Ltd. and Thin Film Devices Co., Ltd., respectively.

Device fabrication: n-i-p Device Fabrication. Devices were prepared on conductive fluorine-doped tin oxide (FTO)-coated glass substrates. The substrates were cleaned extensively by deionized water, acetone, and isopropanol. A compact titanium dioxide ($TiO_2$) layer of about 40 nm was deposited by spray pyrolysis of 7-mL 2-propanol solution containing 0.6-mL titanium diisopropoxide bis(acetylacetonate) solution (75% in 2-propanol, Sigma-Aldrich) and 0.4-mL acetylacetone at 450° C. in air. On top of this layer, mesoporous titanium dioxide was formed by spin-coating 30-nm-sized nanoparticles (Dyesol 30NRD, Dyesol) diluted in ethanol (1:6 w/w) at 4,500 rpm for 15 s. The $Cs_{0.05}FA_{0.81}MA_{0.14}PbI_{2.57}Br_{0.43}$ precursor solution was prepared in a glovebox from a 1.4 M $Pb^2$ ($PbI_2$ and $PbBr_2$) and in the mixed solvent of DMF and DMSO; the volume ratio of DMF/DMSO is 4:1. The spin-coating procedure was performed by 2,000 rpm for 10 s followed with 6,000 rpm for 30 s. At 15 s before the last spin-coating step, 140 μL of chlorobenzene were pipetted onto the substrate. Thereafter, the substrate was put onto a hotplate for 1 h at 100° C. Subsequently, the hole-transporting layer (HTM) was deposited on the top of the perovskite by spin coating at 4,000 rpm for 15 s. The spiro-OMeTAD solutions were prepared dissolving the spiro-OMeTAD in 1-mL chlorobenzene at a concentration of 60 mM, with the addition of 30 mM bis(trifluoromethanesulfonyl)imide lithium salt from a stock solution in acetonitrile, 200 mM of tert-butylpyridine. The devices were finalized by thermal evaporation of 100-nm gold. p-i-n Device Fabrication. The pre-patterned ITO glass (15Ω $sq^{-1}$) was sequentially cleaned using acetone and isopropanol alcohol. The hole transporting layer poly[bis(4-phenyl)(2,4,6-trimethylphenyl)amine (PTAA) (Sigma-Aldrich, 2 mg/ml in isopropanol) were spin-coated on the ITO/glass substrates at 5,000 rpm for 30 s and annealed at 100° C. for 10 min. The $Cs_{0.05}FA_{0.8}MA_{0.15}PbI_{2.55}Br_{0.45}$ perovskite precursor were spin-coated on the ITO/PTAA substrates at 5000 rpm for 30 s. During the spin-coating, 800 ul of diethyl ether (DEE) was dropped onto the spinning substrates. The resulting perovskite layers were annealed at 100° C. for 10 min. After that, $C_{60}$ (30 nm)/bathocuproine (BCP) (6 nm)/Ag (100 nm) were sequentially deposited by thermal evaporation.

Encapsulation of PSC devices: DMDP-laminated EVA tapes are prepared by laminating 0.57 M DMDP in ethyl alcohol solution onto the inner side of the EVA layer using a doctor blade with a gap of 10 μm. For the front side (glass) DMDP-laminated EVA tape, the DMDP solution is blade-coated twice onto EVA layer. While for the backside (metal electrode) tape, the same blade-coating method is applied three times. In between each time, the DMDP layer should be blown to dry). The thickness of the DMDP layer is estimated by measuring the mass difference before and after the lamination. By knowing the density of dry DMDP (1.05 $g/cm^3$) and area of the EVA layer. Both n-i-p and p-i-n devices were encapsulated in two ways: (1) devices encapsulated by bare EVA layers on both the glass side and metal electrode side; (2) devices encapsulated with a ~5.7 μm DMDP-laminated EVA tape on the glass side and ~10 μm DMDP-laminated EVA tape on metal electrode side. The DMDP-laminated EVA tapes were softened to seal the edge of devices by heat treatment using a heat-gun, thereafter the extra layers on edge were cut off to regulate the encapsulation.

Device PV performance characterization: Solar cell performance measurements were taken under a simulated AM 1.5G illumination (100 $mW/cm^2$, Oriel Sol3A Class AAA Solar Simulator). The photocurrent density-voltage (JV) characteristics were measured using a Keithley 2400 source meter. The JV curves of all devices were measured by masking the active area with a metal mask of area 0.12 $cm^2$. Both backward-scan and forward-scan curves were measured with a bias step of 10 mV and delay time of 0.05 s. The continuous current and power output were measured using a potentiostat (Princeton Applied Research, Versa STAT MC). External quantum efficiency (EQE) spectra of solar cells were measured using a solar cell quantum-efficiency measurement system (QEX10, PV Measurements).

Lead-absorption characterization: The UV-Vis transmission spectra were conducted with an UV-Vis spectrometer (UV-2600, Shimadzu Scientific Instruments) at a spectral range of 300 to 1100 nm. Outdoor exposure of the encapsulated devices was conducted between July and October of 2020 on the rooftop. The samples were collected after three months for further analysis. The lead detection in water solutions was conducted by flame atomic absorption spectrophotometry (FAAS) and inductively coupled plasma mass spectrometry (ICP-MS). FAAS was performed with an AA-6200 (Shimadzu Scientific Instruments) and equipped with a Pb lamp as the cathode for radiation source. The resonance line wavelength was set at 217 nm. An acetylene/air flame with a flow ratio of 1:4, lamp current of 12 mA, and a slit of 0.7 nm under the mode of BGC-D2 were applied. The calibration curve was prepared by $PbI_2$ solutions (pure water or 2% $HNO_3$/water) in different concentrations and referenced as a standard to determine the baseline of aqueous lead content in different conditions. For low lead concentrations (<0.1 ppm), ICP-MS was used based on a computer-controlled (QTEGRA software) Thermo iCapQ ICP-MS (Thermo Fisher Scientific, Waltham, MA, USA) operating in STD mode and equipped with an ESI SC-2DX PrepFAST autosampler (Omaha, NE, USA). Nickle skimmer and sample cones were used from Thermo Scientific (part numbers 1311870 and 3600812). The internal standard was added inline using the prepFAST system and consisted of 1 ng/mL of a mixed element solution containing Bi, In, $^{6}Li$, Sc, Tb, Y (IV-ICPMS-71D from Inorganic Ventures). Each sample was acquired using 1 survey run (10 sweeps) and 3 main (peak jumping) runs (40 sweeps). The isotopes selected for analysis were 216,207,208Pb and $^{89}Y$, $^{115}In$ $^{159}Th$, $^{209}Bi$ (chosen as internal standards for data interpolation and machine stability). The limit of detection for lead on ICP-MS is <0.005 ppb. Instrument performance is optimized daily through autotuning followed by verification via a performance report (passing manufacturer specifications).

Examples

Example 1. A composition comprising: a metal-sequestering material; and a support material, wherein: the composition is substantially transparent to light having a wavelength greater than or equal to 350 nm, the composition is in the form of a layer having a thickness between 0.1 μm and 1 mm, the metal-sequestering material is capable of absorbing a metal comprising at least one of a post-transition metal, a metalloid, an alkali metal, or an alkaline earth metal, and the metal-sequestering material has an absorption capacity for the metal between about 1E-2 g metal/$cm^2$ and about 1E-7 g metal/$cm^2$.

Example 2. The composition of Example 1, wherein the metal comprises at least one of lead or tin.

Example 3. The composition of either Example 1 or Example 2, wherein the thickness is between 0.1 μm and 100 μm.

Example 4. The composition of any one of Examples 1-3, wherein the thickness is between 1.0 μm and about 10 μm.

Example 5. The composition of any one of Examples 1-4, wherein the layer has a width between 0.1 meters and 2 meters.

Example 6. The composition of any one of Examples 1-5, wherein the layer has a length between 0.1 meters and 1,000 meters.

Example 7. The composition of any one of Examples 1-6, wherein the layer is positioned on a tube configured to be used in a roll-to-roll manufacturing process.

Example 8. The composition of any one of Examples 1-7, wherein the metal-sequestering material comprises at least one of P, P'-di(2-ethylhexyl)methanediphosphonic acid (DMDP), N,N,N',N'-ethylenediaminetetrakis(methylenephosphonic acid), dimercaptosuccinic acid, ethylenediaminetetraacetic acid, nitrilotriacetic acid, ethylenediaminedisuccinic acid, iminodisuccinic acid, methylglycine diacetic acid, L-Glutamic acid N,Ndiacetic acid, 2-hydroxyethyliminodiacetic acid, ethylenediamine-N,N'-dimalonic acid, ethylenediamine-N,N'-diglutaric acid, 3-hydroxy-2,2-iminodisuccinic acid, and/or 2,6-pyridine dicarboxylic acid, poly ethylene glycol, poly vinyl alcohol, or poly vinyl pyrrolidone.

Example 9. The composition of any one of Examples 1-8, wherein the metal-sequestering material comprises P, P'-di (2-ethylhexyl)methanediphosphonic acid (DMDP).

Example 10. The composition of any one of Examples 1-9, wherein the support material comprises at least one of a polyolefin, an epoxy resin, a silicone, an acrylic, or a polyester.

Example 11. The composition of any one of Examples 1-10, wherein the support material comprises at least one of ethylene vinyl acetate (EVA), (polyvinylidene fluoride), polyethylene (PE), polypropylene (PP), polymethylpentene (PMP), polybutene-1 (PB-1), polydimethylsiloxane, bisphenol A diglycidyl ether, polymethylmethacrylate, polyhydroxyethylmethacrylate, or polyethylene terephthalate.

Example 12. The composition of any one of Examples 1-11, wherein the support material comprises ethylene vinyl acetate (EVA).

Example 13. The composition of any one of Examples 1-12, wherein: the layer comprises a first layer and a second layer, the first layer comprises the metal-sequestering material, the second layer comprises the support material, and the first layer is positioned adjacent to the second layer.

Example 14. The composition of any one of Examples 1-13, wherein the first layer is in physical contact with the second layer.

Example 15. The composition of any one of Examples 1-14, wherein the first layer has a thickness between 0.1 μm and 1 mm.

Example 16. The composition of any one of Examples 1-15, wherein the second layer has a thickness between 0.1 μm and 1 mm.

Example 17. A device comprising: a perovskite-containing layer, and a metal-sequestering tape, wherein: the device has a front-side and a back-side, and the metal-sequestering tape is configured to isolate at least the front-side and the back-side from an external environment.

Example 18. The device of Example 17, wherein: the metal-sequestering tape comprises: a metal-sequestering material; and a support material, wherein: the metal-sequestering tape is substantially transparent to light having a wavelength greater than or equal to about 350 nm, the metal-sequestering tape has a thickness between 0.1 μm and 1 mm, the metal-sequestering material is capable of absorbing a metal comprising at least one of a post-transition metal, a metalloid, an alkali metal, or an alkaline earth metal, and the metal-sequestering material has an absorption capacity for the metal between about 1E-2 g metal/$cm^2$ and about 1E-7 g metal/$cm^2$.

Example 19. The device of either Example 17 or Example 18, wherein the perovskite-containing layer is configured as at least one of a light-absorbing layer or a light-emitting layer.

Example 20. The device of any one of Examples 17-19, wherein: the metal-sequestering tape comprises: a first layer comprising the metal-sequestering material; and a second layer comprising the support material, wherein: the first layer is positioned adjacent to the second layer.

Example 21. A roll-to-roll manufacturing method comprising: manufacturing a device by applying a perovskite-containing layer to a substrate; and encapsulating the device within a metal-sequestering tape, wherein: the metal-sequestering tape comprises: a metal-sequestering material; and a support material, wherein: the metal-sequestering tape is substantially transparent to light having a wavelength greater than or equal to about 350 nm, the metal-sequestering tape has a thickness between 0.1 μm and 1 mm, the metal-sequestering material is capable of absorbing a metal comprising at least one of a post-transition metal, a metalloid, an alkali metal, or an alkaline earth metal, and the metal-sequestering material has an absorption capacity for the metal between about 1E-2 g metal/$cm^2$ and about 1E-7 g metal/$cm^2$.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A roll-to-roll manufacturing method comprising:

forming a stack comprising:

a frontside and a backside with a perovskite layer and at least one of an electrode or a transport layer positioned between the frontside and the backside; and encapsulating both the frontside and the backside of the stack within a bilayer structure comprising:

a metal-sequestering layer, and a support layer, wherein:

the bilayer structure is transparent to light having a wavelength greater than or equal to 350 nm, and the metal-sequestering layer is capable of absorbing a metal comprising at least one of a post-transition metal, a metalloid, an alkali metal, an alkaline earth metal, or a combination thereof.

2. The method of claim 1, where the bilayer structure has a thickness between 0.1 μm and 1 mm.

3. The method of claim 1, wherein the metal-sequestering layer has an absorption capacity for the metal between 1E-2 g metal/$cm^2$ and 1E-7 g metal/$cm^2$.

4. The method of claim 1, wherein the forming comprises:

a first depositing of the perovskite layer onto the electrode or the transport layer, wherein:

the first depositing is performed using a first liquid-deposition method.

5. The method of claim 4, wherein the first liquid-deposition method comprises at least one of blade coating, slot-die coating, spray coating, inkjet printing, or a combination thereof.

6. The method of claim 4, wherein the encapsulating comprises a second depositing of the bilayer structure onto the stack.

7. The method of claim 6, wherein the first depositing is performed such that the perovskite layer and the electrode or the transport layer are deposited onto a continuously moving, flexible substrate.

8. The method of claim 1, wherein the bilayer structure is flexible.

9. The method of claim 6, wherein, prior to the second depositing, at least one of the metal-sequestering layer, the support layer, or a combination thereof are formed using a second liquid-deposition method comprising at least one of blade coating, slot-die coating, spray coating, inkjet printing, or a combination thereof.

10. The method of claim 9, wherein the bilayer structure is positioned on a tube configured to deposit the bilayer structure onto the stack during the second depositing.

11. The method of claim 7, wherein the flexible substrate comprises at least one of a plastic, a metal, or a combination thereof.

12. The method of claim 1, wherein the support layer comprises at least one of a polymer, a resin, or a combination thereof.

13. The method of claim 1, wherein the metal-sequestering layer comprises at least one of an amine group, an amide group, a hydrazine group, an isocyanate group, a nitrile group, a nitrite group, or a combination thereof.

14. The method of claim 1, wherein the perovskite layer comprises $Cs_{1-x-y}FA_xMA_yPbI_{1-z}Br_z$ and each of x, y, and z are independently between zero and one, inclusively.

* * * * *